(12) United States Patent
Cheng et al.

(10) Patent No.: US 11,467,637 B2
(45) Date of Patent: Oct. 11, 2022

(54) MODULAR COMPUTER COOLING SYSTEM

(71) Applicant: Coolanyp, LLC, Kirkland, WA (US)

(72) Inventors: Peng Cheng, Redmond, WA (US); Dai Ying Wu, Kirkland, WA (US); Zhe Wen, Los Altos, CA (US)

(73) Assignee: Wuxi Kalannipu Thermal Management Technology Co., Ltd., Jiangsu (CN)

( * ) Notice: Subject to any disclaimer, the term of this patent is extended or adjusted under 35 U.S.C. 154(b) by 0 days.

(21) Appl. No.: 16/522,213

(22) Filed: Jul. 25, 2019

(65) Prior Publication Data

US 2020/0042053 A1    Feb. 6, 2020

Related U.S. Application Data

(60) Provisional application No. 62/712,672, filed on Jul. 31, 2018.

(51) Int. Cl.
*G06F 1/20* (2006.01)
*H05K 7/20* (2006.01)

(52) U.S. Cl.
CPC ........... *G06F 1/20* (2013.01); *H05K 7/20327* (2013.01); *H05K 7/20336* (2013.01); *H05K 7/20509* (2013.01)

(58) Field of Classification Search
CPC .. G06F 1/20; H05K 7/20327; H05K 7/20336; H05K 7/20509
USPC .................................................... 361/679.32
See application file for complete search history.

(56) References Cited

U.S. PATENT DOCUMENTS

| | | | |
|---|---|---|---|
| 4,235,285 A | * | 11/1980 | Johnson .............. H01L 23/4093 165/169 |
| 4,921,041 A | | 5/1990 | Akachi |
| 5,219,020 A | | 6/1993 | Akachi |
| 5,253,702 A | | 10/1993 | Davidson et al. |
| 5,506,032 A | | 4/1996 | Rowe |

(Continued)

FOREIGN PATENT DOCUMENTS

| | | |
|---|---|---|
| CN | 102138374 B | 7/2011 |
| CN | 206488673 U | 9/2017 |

(Continued)

OTHER PUBLICATIONS

Ashby, W. Ross, "Principles of the self-organizing system," E:CO Special Double Issue vol. 6, Nos. 1-2, 2004, pp. 102-126.

(Continued)

*Primary Examiner* — Abhishek M Rathod
*Assistant Examiner* — Keith DePew
(74) *Attorney, Agent, or Firm* — Lee & Hayes, P.C.

(57) ABSTRACT

A modular cooling system can include thermal bridges for separate modules of a computer system that passively transfer heat away from heat sources of the modules. The thermal bridges can be thermally connected to a cold plate having a fluid path for liquid coolant. The cold plate can be positioned in, or linked to, a cooling dock having a pump and at least one cooling element such as a radiator or fan system. Heat from separate modules can be passively transferred via thermal bridges to cold plates, where liquid pumped through the cold plates can transfer the heat to the cooling elements of the cooling dock to be dissipated.

20 Claims, 23 Drawing Sheets

(56) References Cited

U.S. PATENT DOCUMENTS

| | | | | |
|---|---|---|---|---|
| 5,886,872 | A * | 3/1999 | Koenen | G06F 1/20 |
| | | | | 361/698 |
| 5,944,092 | A | 8/1999 | Van Oost | |
| 5,946,189 | A * | 8/1999 | Koenen | G06F 1/20 |
| | | | | 361/698 |
| 6,105,662 | A | 8/2000 | Suzuki | |
| 6,349,035 | B1 * | 2/2002 | Koenen | H01L 23/473 |
| | | | | 29/890.03 |
| 6,388,882 | B1 * | 5/2002 | Hoover | F28D 15/0266 |
| | | | | 361/689 |
| 6,411,512 | B1 * | 6/2002 | Mankaruse | H05K 7/20336 |
| | | | | 174/15.1 |
| 7,036,574 | B2 * | 5/2006 | Thompson | F28D 15/0233 |
| | | | | 165/185 |
| 7,310,231 | B2 | 12/2007 | Ouyang | |
| 7,768,783 | B1 | 8/2010 | Kajiya et al. | |
| 8,564,951 | B1 | 10/2013 | Watanabe et al. | |
| 8,934,235 | B2 | 1/2015 | Rubenstein et al. | |
| 9,109,846 | B2 | 8/2015 | Chen et al. | |
| 10,334,763 | B2 * | 6/2019 | Gao | H05K 7/20218 |
| 10,455,735 | B2 * | 10/2019 | Cheng | H05K 7/20327 |
| 2001/0023757 | A1 | 9/2001 | Huang | |
| 2003/0051857 | A1 | 3/2003 | Cluzet et al. | |
| 2003/0192669 | A1 * | 10/2003 | Wu | F28D 15/0241 |
| | | | | 165/46 |
| 2007/0227709 | A1 | 10/2007 | Upadhya et al. | |
| 2007/0256814 | A1 | 11/2007 | Moon et al. | |
| 2008/0174962 | A1 | 7/2008 | Belady et al. | |
| 2008/0251911 | A1 * | 10/2008 | Farnsworth | H01L 23/4093 |
| | | | | 257/714 |
| 2008/0285224 | A1 | 11/2008 | Odanaka et al. | |
| 2009/0056911 | A1 | 3/2009 | Hongo | |
| 2009/0154104 | A1 | 6/2009 | Kondo et al. | |
| 2009/0277616 | A1 | 11/2009 | Cipolla et al. | |
| 2010/0089553 | A1 | 4/2010 | Yang | |
| 2010/0122804 | A1 | 5/2010 | Yang | |
| 2011/0036538 | A1 * | 2/2011 | Brunschwiler | H01L 23/427 |
| | | | | 165/104.31 |
| 2011/0198057 | A1 * | 8/2011 | Lange | F28D 15/0233 |
| | | | | 165/104.21 |
| 2011/0209864 | A1 | 9/2011 | Figus et al. | |
| 2011/0303394 | A1 | 12/2011 | Branton | |
| 2012/0147553 | A1 * | 6/2012 | Eriksen | H05K 7/20272 |
| | | | | 361/679.53 |
| 2013/0133871 | A1 | 5/2013 | Ma et al. | |
| 2013/0208422 | A1 | 8/2013 | Hughes et al. | |
| 2014/0043765 | A1 | 2/2014 | Gohara et al. | |
| 2014/0321050 | A1 | 10/2014 | Sato et al. | |
| 2015/0000864 | A1 | 1/2015 | Kobayashi | |
| 2015/0060020 | A1 | 3/2015 | Yang | |
| 2015/0068703 | A1 | 3/2015 | de Bock et al. | |
| 2015/0276322 | A1 | 10/2015 | Bolin | |
| 2017/0042058 | A1 | 2/2017 | Pope et al. | |
| 2017/0257982 | A1 * | 9/2017 | Cheng | H05K 7/20381 |
| 2018/0341298 | A1 | 11/2018 | Cheng et al. | |
| 2019/0130519 | A1 * | 5/2019 | Hu | G06F 1/203 |
| 2019/0150326 | A1 * | 5/2019 | Gao | H05K 7/20745 |
| | | | | 361/679.47 |
| 2019/0394902 | A1 | 12/2019 | Cheng | |

FOREIGN PATENT DOCUMENTS

| | | |
|---|---|---|
| CN | 108012513 A | 5/2018 |
| CN | 111630470 A | 9/2020 |
| EP | 0874539 A2 | 10/1998 |
| JP | 2001165585 A | 6/2001 |
| JP | 2003240459 A | 8/2003 |
| JP | 2006245114 | 9/2006 |
| JP | 2007010249 A | 1/2007 |
| JP | 2008197344 A | 8/2008 |
| JP | 2009059801 A | 3/2009 |
| JP | 2010007893 A | 1/2010 |
| JP | 2013065227 | 4/2013 |
| WO | WO2016209496 | 12/2016 |

OTHER PUBLICATIONS

Bak, et al., "Self-Organized Criticality: An Explanation of 1/f Noise," Physical Review Letters, The American Physical Society, vol. 59, No. 4, Jul. 27, 1987, pp. 381-384.

Cheng, et al., "A Mathematical Model of an Oscillating Heat Pipe," Heat Transfer Engineering, , vol. 32, Issue 11-12, (2011), pp. 1037-1046. Also available at: http://dx.doi.org/10.1080/01457632.2011.556495.

Cheng, et al., "An Investigation of Flat-Plate Oscillating Heat Pipes," Journal of Electronic Packaging, ASME, 041009-6, vol. 132, Dec. 2010, 6 pages.

Gershenson, et al., "When Can We Call a System Self-Organizing? ", Advances in Artificial Life, published Sep. 14, 2003, 8 pages.

Donald T. Jacobs, Resource Letter SOP-1I Self-Organizing Physics, American Association of Physics Teachers, American Journal of Physics, vol. 83, No. 8, Aug. 2015), pp. 680-687. Also available http://dx.doi.org/10.1119/1.4922338.

Khan, et al., "Convergence Analysis of a New Self Organizing Map Based Optimization (SOMO) Algorithm," Cognitive Computation, Aug. 2015, vol. 7, Issue 4, pp. 477-486.

Ma, et al., "Heat Transport Capability in an Oscillating Heat Pipe," Journal of Heat Transfer, ASME, vol. 130 / 08501-3, Aug. 2008, pp. 081501-1 through 081501-7.

Nino, et al., "Characterization of Two-Phase Flow in Microchannels, Air Conditioning and Refrigeration Center," a National Science Foundation/University Cooperative Research Center, University of Illinoi at Urbana-Champaign, ACRC TR-202, Oct. 2002, 110 pages.

Office Action for U.S. Appl. No. 15/060,426, dated Dec. 4, 2018, Cheng, "Self-Organizing Thermodynamic System", 9 pages.

Office action for U.S. Appl. No. 15/605,693, dated Jun. 1, 2018, Cheng, "Hub-Link Liquid Cooling System", 21 pages.

PCT Search Report and Written Opinion dated May 25, 2017 for PCT Application No. PCT/US17/19130, 10 pages.

The PCT Search Report and Written Opinion dated Aug. 9, 2018, for PCT Application No. PCT/US18/28647, 13 pages.

Rajmohan Rajaraman, "Introduction to Dynamic Networks Models, Algorithms, and Analysis", Dynamo Training School, Lisbon, Portugal, Jun. 28-Jul. 1, 2006, 77 pages.

E.V. Rebrov, "Two-Phase Flow Regimes in Microchannels", Theoretical Foundations of Chemical Engineering, ISSN 0040-5795,, 2010, vol. 44, No. 4, pp. 355-367.

Teng, et al., "Fluid Dynamics in Microchannels," Fluid Dynamics, Computational Modeling and Applications, Dr. L. Hector Juarez (Ed.), ISBN: 978-953-51-0052-2, InTech, (2012), pp. 403-437. Also available from: http://www.intechopen.com/books/fluid-dynamicscomputational-modeling-and-applications/fluid-dynamics-in-microchannels.

Thompson, et al., "An experimental investigation of a three-dimensional flat-plate oscillating heat pipe with staggered microchannels,", Intenrational Journal of Heat and Mass Transfer, 54 (2011), pp. 3951-3959.

The PCT Seach Report dated Nov. 11, 2019, for PCT Application No. PCT/US2019043717, 12 pages.

Chinese First Office Action for Chinese Application No. 201980005869.6, dated Dec. 3, 2021, a counterpart foreign application of U.S. Appl. No. 16/522,213, 18 pages.

Office Action for U.S. Appl. No. 16/562,120, dated Feb. 7, 2022, Cheng, "Self-Organizing Thermodynamic System", 8 Pages.

* cited by examiner

MODULAR COMPUTER COOLING SYSTEM

RELATED APPLICATIONS

This U.S. Patent Application claims priority to U.S. Provisional Patent Application No. 62/712,672, entitled "Cooling Method that Facilitates Modularization of Electronics," filed on Jul. 31, 2018, the entirety of which is incorporated herein by reference.

BACKGROUND

Computing systems can have modular designs that allow individual modules, such as graphics cards, memory modules, storage drives, optical drives, and/or other modules to be removable and interchangeable. Such a modular design scheme can be flexible and allow users to customize and/or upgrade their computing systems.

Cooling systems can be used in computing systems to transfer heat generated by such modules away from the modules. Some cooling systems can use air cooling and/or liquid cooling. For instance, a fan system can be installed in an enclosure of a computing system that houses one or more modules to blow ambient air through the enclosure and thereby cool the modules and remove heat generated by the modules.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items or features.

DETAILED DESCRIPTION

Figure 1:
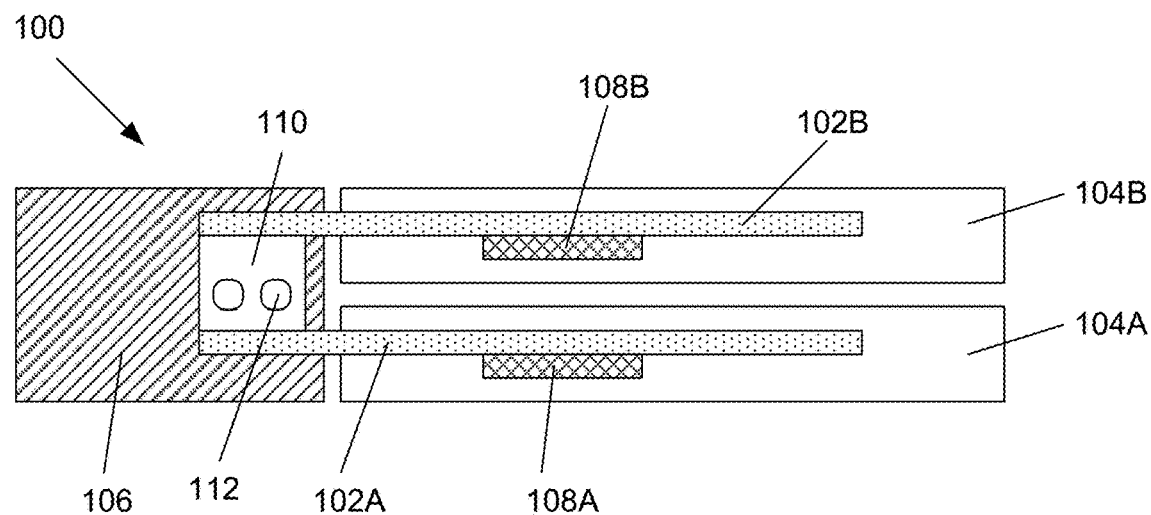
FIG. 1 depicts an example of a computing system.

Computing systems are often built using modular design schemes that allow individual hardware modules to be interchangeable. For example, such modules can include mainboards, processors, graphics cards, memories, storage drives, optical drives, power supplies, add-on cards, and other types of modules. However, existing solutions for cooling computer systems can limit the potential of modular designs for computing systems.

Some existing cooling systems use air cooling. However, such systems often have individual thermal modules for electronic components, such as passive metal heatsinks and active thermal modules with cooling fans and metal heatsinks. Generally, the electronic components are installed in an enclosure with venting holes that allow the passage of ambient air. Fans in the active thermal modules can drive cooling air past or through the electronic components, and in some examples other independent fan systems can also be attached to the enclosure generally to strengthen or regulate air flow. Although these types of cooling systems can be used with interchangeable hardware modules, having active thermal modules with fans for each individual module may be bulky. This can limit the number of modules that can be present in a computing system and/or limit where such modules can be positioned within an enclosure. Such existing cooling systems may also be insufficient to cool many modern modules that may have more than one component that generates significant heat.

Some existing cooling systems use liquid cooling. These types of cooling systems often use separate cold plate modules for individual electronic components, such as central processing units (CPUs), graphics processing units (GPUs), memory modules, storage drives, and/or other heat-generating components. Such separate cold plate modules often each include various elements, including a customized cold plate, a pump, a liquid loop, a radiator, a group of fans, and/or other auxiliary parts. When different cold plate modules have their own elements including pumps, radiators, and fans, it can be bulky and difficult to fit multiple cold plate modules into enclosures. In some cases, cold plate modules can be used in conjunction with air cooling systems to add additional cooling capacity, but the combination of both types of cooling systems can be even more bulky and further limit the number and/or position of electronic component modules that can fit into an enclosure.

Overall, although some existing cooling systems can be used with modular components of a computing system, they are often bulky, have complex structures, and/or must be highly customized to individual modular components. This can reduce the ability to achieve the flexibility, expandability, and interchangeability that can otherwise be benefits of modular designs for computing systems.

Described herein are systems and methods that, in at least some examples, can transfer heat away from multiple individual modules of a computing system, while using less space than existing systems. For example, thermal bridges for each individual module can be in thermal communication with distinct or shared cold plates that are in, or interface with, a shared cooling dock that includes shared components, such as, for example, pumps, radiators, and/or fans. By sharing these cooling components among multiple modules with separate thermal bridges, space requirements for the overall system can be reduced.

The systems and methods described herein, in at least some examples, can also have better or comparable efficiency as other cooling systems. For example, some existing cooling systems position a cold plate directly against a CPU or other heat source, without using an intermediate thermal bridge. In these existing systems, the cold plate directly positioned against the heat source can include a group of channels, each with a diameter of 1 millimeter or less, and liquid coolant can be actively pumped through these channels to transfer heat away from the heat source. However, some systems and methods described herein can instead use a thermal bridge, a passive heat transfer device and/or heat spreader, to transfer heat away to a cold plate that is not directly against a heat source. In some examples, the cold plate described herein may have a single, larger, fluid channel instead of a group of smaller channels like existing cold plates. Because the thermal bridge can itself be a heat spreader that can spread heat from a heat source to a larger surface area in contact with the cold plate, the single fluid channel of the cold plate can transfer heat away at least as effectively as designs with groups of smaller channels. Having a single fluid channel can also have other benefits, including lowering pressure head, eliminating fouling impacts, and lowering fabrication costs.

Additionally, configuring the thermal bridges and/or cold plates to interface with other shared cooling elements can reduce or eliminate the need for distinct and separate cooling solutions for different electronic components, and instead achieve a universal or standardized cooling system that still allows the modular design of a computing system to be flexible and expandable with interchangeable modules. Accordingly, the cooling systems and methods described herein, in at least some examples, can expand the full potential of modular design for computing systems and enable a higher degree of design freedom.

FIG. 1 depicts an example of a computing system 100. The computing system 100 can include a set of thermal bridges 102 for a corresponding set of modules 104. The computing system 100 can also include one or more cooling docks 106. The thermal bridges 102 can be heat spreaders and/or passive heat transfer devices configured to transfer heat generated by one or more heat sources 108 of the modules 104 to cold plates 110 in thermal contact with at least a portion of the thermal bridges 102. Each cold plate 110 can have a fluid path 112 that allows heat transferred to the cold plate 110 via a thermal bridge 102 to be absorbed by a liquid coolant passing through the cold plate 110 and into portions of the cooling dock 106 where the heat can be dissipated. In some examples, a cold plate 110 can be positioned within the cooling dock 106, and thermal bridges can extend from the modules 104 into the cooling dock 106 to connect with the cold plate 110, for example, as shown in FIG. 1. In other examples, a cold plate 110 can be integrated into a portion of a thermal bridge 102, or be part of a dedicated cooling assembly for a particular module 104 that includes at least one thermal bridge 102 and at least one dedicated cold plate 110 for that module 104, as will be discussed further below.

Each module 104 can be a removeable and/or interchangeable element of the computing system 100. At least some of the modules 104 can provide or enable different functions of the computing system 100. For example, modules 104 can include central processing unit (CPU) modules, graphics processing unit (GPU) modules, and modules for other elements including storage drives, optical drives, power supplies, add-on cards, and/or any other type of computing element. The modules 104 may include one or more heat sources 108. For example, a module 104 may include heat sources 108, such as CPUs and/or GPUs that generate relatively large amounts of heat during operation. Other heat sources 108 can include voltage regulator modules (VRMs), random access memory (RAM) modules or other memory elements, and/or other elements that can also generate heat during operation.

One or more thermal bridges 102 can be provided for each module 104. In some examples, a separate thermal bridge 102 can extend to a cooling dock 106 from each module 104 that has one or more heat sources 108 expected to generate at least a threshold amount of heat. At least a first portion of a thermal bridge 102 can be positioned against or be proximate to a heat source 108 at a module 104, while at least a second portion of the thermal bridge 102 can be, or be positioned against, a cold plate 110. The thermal bridge 102 can be configured to transfer heat generated by one or more heat sources 108 to the cold plate 110. The cold plate 110 can have one or more fluid paths 112 through which a liquid coolant can flow in order to absorb heat and transfer the heat, via the fluid flow, into other elements of a cooling dock 106 to be dissipated as discussed further below. In some examples, thermal interfacial materials (TIMs), such as a thermal pad or a thermally conductive substance, can be positioned or applied at thermal contact areas between surfaces of a thermal bridge 102 that contact a heat source 108 or a cold plate 110. TIMs can minimize thermal contact resistance between adjacent surfaces of different elements.

In some examples, a thermal bridge 102 can include a self-organizing thermodynamic system (SOTS), for example, as described in U.S. patent application Ser. No. 15/060,426, which is incorporated by reference herein. In these examples, the thermal bridge 102 can be a passive heat transfer device that has a solid body embedded with at least one SOTS network of interconnected capillary microchannels. A two-phase working fluid can be held within the SOTS network of microchannels, such that self-organizing two-phase fluid flow inside the network of microchannels can transfer heat from thermal energy absorption (TEA)

nodes proximate to heat sources 108 to thermal energy dissipation (TED) nodes where the heat can be transferred into a cold plate 110 and/or cooling dock 106 to be dissipated. The heat transportation through microchannels in a SOTS network can occur in a network communication manner. More particularly, an SOTS network of microchannels can have a node-path structure, where channel paths are joined at TEA nodes or TED nodes of the thermal bridge 102. When heat is transferred through the SOTS thermal bridge 102, the working fluid distributed among the network of microchannels can move through the nodes and channel paths due to a pressure-temperature difference at nodes to form collectively stable dynamic states, which represents state in which self-organizing criticality is reached.

The solid body of an SOTS thermal bridge 102 can have any shape, including planar or non-planar shapes that may in some situations be customized to the shape or architecture of a module 104, such that the self-organizing two-phase fluid flow in the SOTS network of microchannels can transfer heat from one or more TEA nodes at one or more heat sources 108 in the module 104 to one or more TED nodes at one or more cold plates 110. In other examples, a thermal bridge 102 can also, or alternately, include other types of heat transfer elements, such as a heat pipe, a vapor chamber, an embedded cold plate 110 with a fluid path 112, and/or any other heat transfer element.

In some examples, a thermal bridge 102 can have a solid body surrounding a heat transfer element, such as a SOTS network, a heat pipe, a vapor chamber, or other heat transfer element. For example, the solid body can be made of metals, such as aluminum, copper, stainless steel, or other alloys. In some examples, the inner structures for the heat transfer elements can be pre-machined on a solid body, and then be enclosed by processes such as vacuum brazing, atmosphere-controlled brazing, vacuum diffusion bonding, laser welding, electrical beam welding, friction welding, electrical resistance diffusion bonding, ultrasonic soldering, or other fabrication methods.

Figure 2:
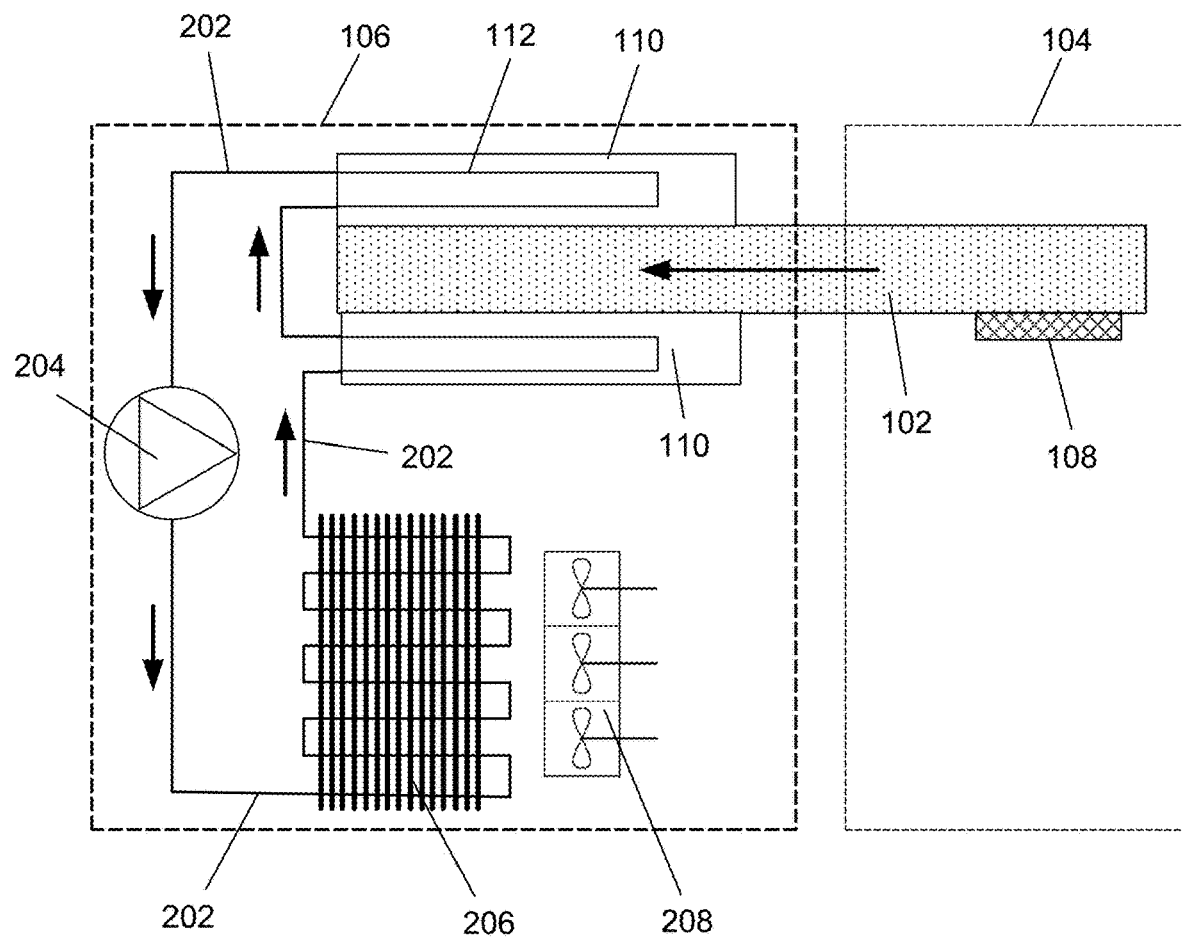
FIG. 2 depicts an example of heat being transferred from modules to cooling docks to be dissipated.

FIG. 2 depicts an example of heat being transferred from modules 104 to cooling docks 106 to be dissipated. As discussed above, in some examples thermal bridges 102 can extend from multiple modules 104 into one or more cooling docks 106, and can be configured to transfer heat generated by one or more heat sources 108 of the modules 104 to one or more cold plates 110 positioned in the cooling docks 106. The heat transfer through the thermal bridge 102 shown in FIG. 2 can accordingly represent heat transfer through multiple thermal bridges 102 from multiple modules 104.

In some examples, a cold plate 110 inside the cooling dock 106 can be in thermal contact with at least a portion of the thermal bridge 102 that extends into the cooling dock 106 from a module 104. In some of these examples, TIMs can be applied at contact areas between surfaces of the thermal bridge 102 and the cold plate 110 to minimize thermal contact resistance. In other examples, a cold plate 110 can be fixed to, for example, integrated into, a portion of a thermal bridge 102 that extends into the cooling dock 106. For instance, portions of a thermal bridge 102 can be soldered onto a cold plate 110, or fins of a cold plate 110 can be fabricated as extended portions of a thermal bridge 102, to minimize thermal contact resistance.

A cold plate 110 can have at least one interior fluid path 112 that connects to tubing 202 that passes through other portions of the cooling dock 106 to form a closed fluid circuit. Liquid coolant can circulate through the interior fluid path 112 of the cold plate 110 and through the tubing 202. In some examples, quick-disconnect fittings, ports, and/or couplings can be used to connect the fluid path 112 of the cold plate 110 to the tubing 202, which in many situations can allow the tubing 202 to be connected and/or disconnected from the cold plate 110 without spilling or dripping the liquid coolant. In other examples, the tubing 202 can connect to the cold plate 110 via open loop connections.

In some examples, the cooling dock 106 can have a pump 204 configured to cause the liquid coolant to circulate through the tubing 202 and the fluid path 112 of the cold plate 110 within the closed fluid circuit. The tubing 202 can also pass through, or pass proximate to, heat dispersal elements, such as a radiator 206 or other heat exchanger, and/or a blower or other fan system 208. The heat dispersal elements can cause heat to be dissipated into the ambient environment around the computing system 100. As an example, a pump 204 can cause liquid that has been heated at the cold plate 110 due to heat transferred from a module 104 via a thermal bridge 102 to flow out of the cold plate 110 via the tubing 202. The pump 204 can also cause the heated liquid to flow through the tubing 202 to the radiator 206. A blower or fan system 208 can drive cooler air through the radiator 206, thereby cooling the liquid passing through the radiator 206 to a lower temperature. The cooled liquid can then pass back to the cold plate 110, where it can again absorb heat being transferred in by the thermal bridge 102 from the module 104.

Figure 3:
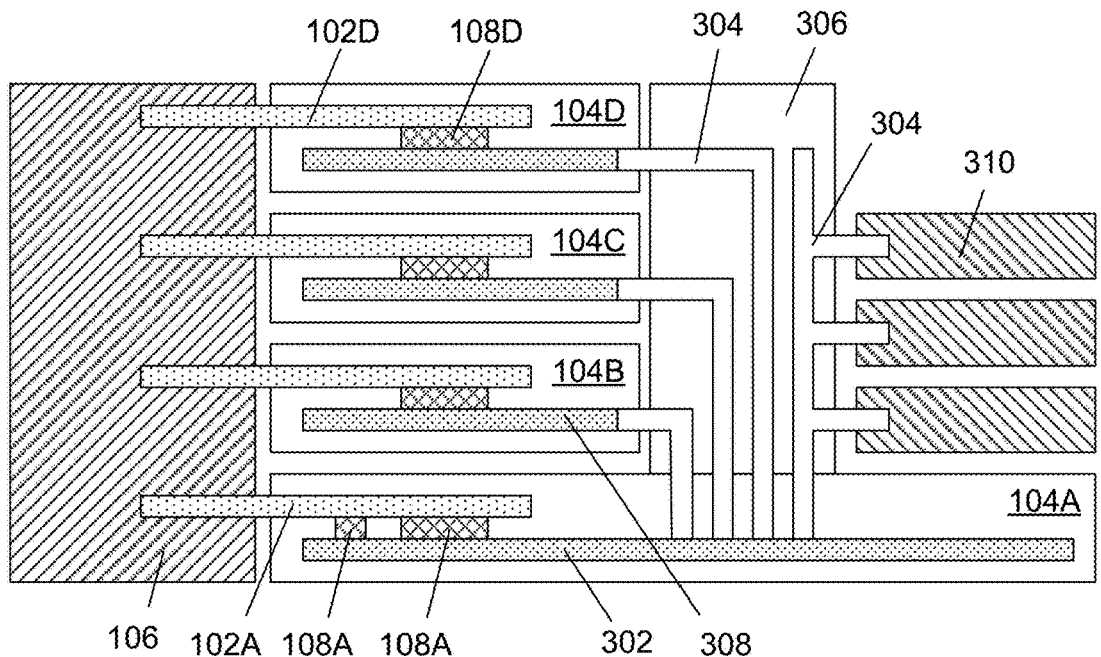
FIG. 3 depicts an example of a computing system with expandable modules.

FIG. 3 depicts an example of the computing system 100 with expandable modules 104. Although FIG. 1 shows an example with two modules 104, the computing system 100 can have space or connections for more than two modules 104.

One of the modules 104 can be a main module 104A that contains a motherboard 302 and primary heat sources 108A, such as one or more CPUs, CPU VRMs, memory modules, and/or other elements. A first thermal bridge 102A can extend from the primary heat sources 108A out of the main module 104A to the cooling dock 106. In some examples, the main module 104A can be independently enclosed in a housing that has openings for electrical and/or data communications with other modules and for thermal communications with the cooling dock 106 via the first thermal bridge 102A.

The main module 104A can also have peripheral connectors 304, such as cable connections, ports, slots, and/or other connectors through which additional modules 104 can connect to the motherboard 302. For example, the main module 104A can have Peripheral Component Interconnect Express (PCIe) slots or similar connectors that can accept corresponding components of other modules 104, and/or connectors for intermediate peripheral connectors 304, such as flexible cables or riser cards, that connect the motherboard 302 to other modules 104. In some examples, peripheral connectors 304, such as flexible cables or riser cards, can be held within a peripheral connection module 306 that extends from the motherboard 302.

One or more add-on modules 104 can be connected to the motherboard 302 of the main module 104 through peripheral connectors 304. Each add-on module 104 can have its own board 308 similar to a motherboard 302, such as a printed circuit board (PCB), that holds heat sources 108 and/or can connect to a peripheral connector 304. Although three add-on modules 104B, 104C, and 104D are shown in the example of FIG. 3, fewer or more add-on modules 104 can be used in the computing system 100. Due to the peripheral connectors 304, add-on modules 104 can be added, removed, or switched out from the computing system 100.

Accordingly, functions of the computing system 100 can be expanded as desired by adding additional modules 104.

Add-on modules 104 with heat sources 108 that are expected to generate at least a threshold amount of heat can have their own dedicated thermal bridges 102 that can be connected to the cooling dock 106. For instance, an independent add-on card, such as GPU card, with its own processing unit and corresponding thermal bridge 102, can be stacked over the main module, and be connected to the motherboard 302 via cables, riser cards, or other peripheral connectors 304. As an example, data communication between a GPU add-on module 104B and a main CPU module 104A can be established using a PCIe extender riser cable that connects PCIe gold fingers of the GPU module 104B to a PCIe slot of the main CPU module 104A.

Other types of modules 104 that are not expected to generate above the threshold amount of heat, such as peripheral devices 310 including hard drives, optical drives, or power supplies, can also be connected to the motherboard 302 via peripheral connectors 304. For instance, such peripheral devices 310 can be stacked above the main module 104A and connected to the motherboard 302 as shown in FIG. 3. In some examples, such peripheral devices 310 may not have thermal bridges 102 that extend to the cooling dock 106 because they are expected to generate less than the threshold amount of heat and may be adequately cooled by natural convection, low speed fans, or other independent cooling mechanisms. However, in other examples, such peripheral devices 310 may also have dedicated thermal bridges 102 that extend to the cooling dock 106 as described herein.

Figure 4:
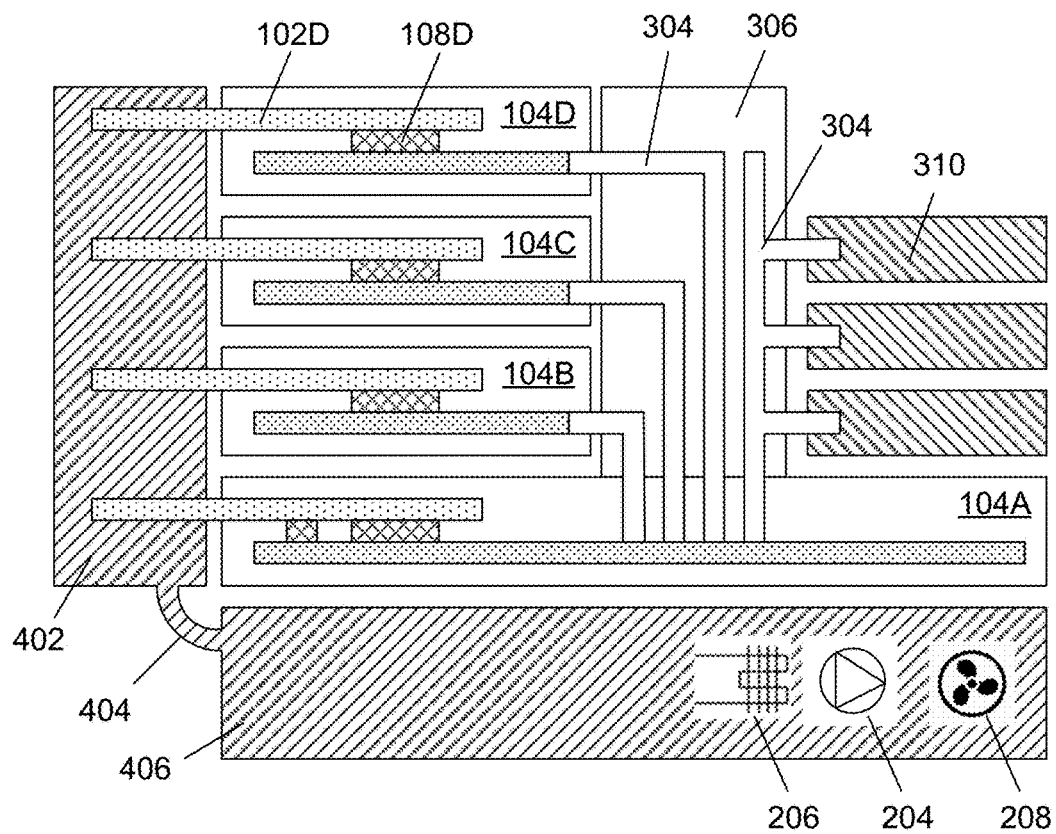
FIG. 4 depicts an alternate example of a computing system with expandable modules.

In some examples, the cooling dock 106 can itself be considered to be a module. For example, the elements of the cooling dock 106 can be self-contained within a single module as shown in FIG. 3. In other examples, the cooling dock 106 can be modularized into multiple modules located at different positions within the computing system 100. For example, FIG. 4 depicts an alternate embodiment in which a set of thermal bridges 102 from a main module 104A and a set of add-on modules 104B-104D connect to one or more cold plates 110 in a cooling connector module 402 of the cooling dock 106, while tubing 202 of the cooling dock 106 passes through a connector 404 to a main cooling module 406 of the cooling dock 106 that houses other elements, such as a pump 204, radiator 206, and/or fan system 208. The cooling connector module 402 and main cooling module 406 can be located at different positions within the computing system 100. For example, the cooling connector module 402 can extend vertically along edges of a set of stacked modules 104, while a main cooling module 406 can extend horizontally above or below the stacked modules 104. In other examples, modules of a cooling dock can be positioned at any other locations of the computing system 100 relative to other modules 104.

Figure 5A:
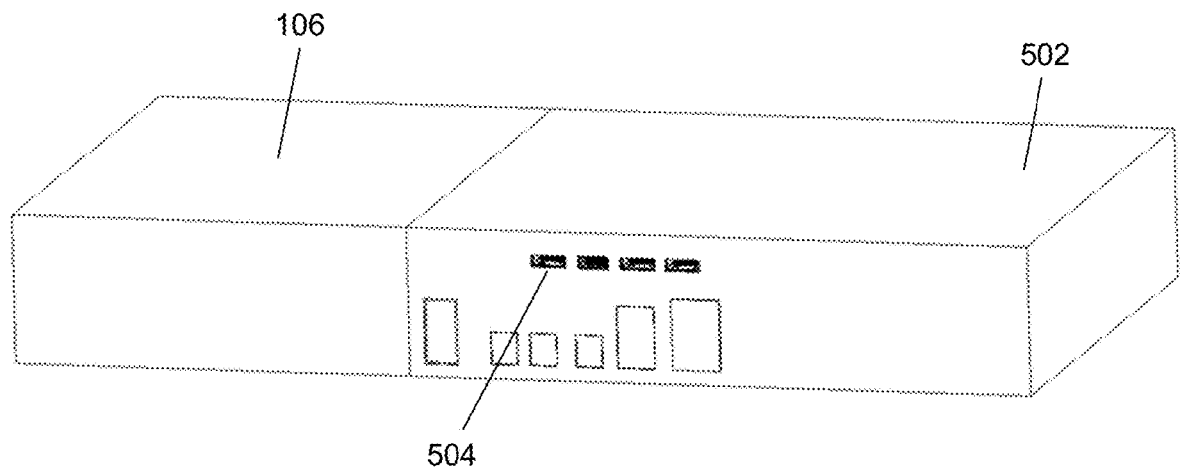
FIGS. 5A and 5B depict views of a non-limiting example of a computing system in which modules are stored within a module housing.
Figure 5B:
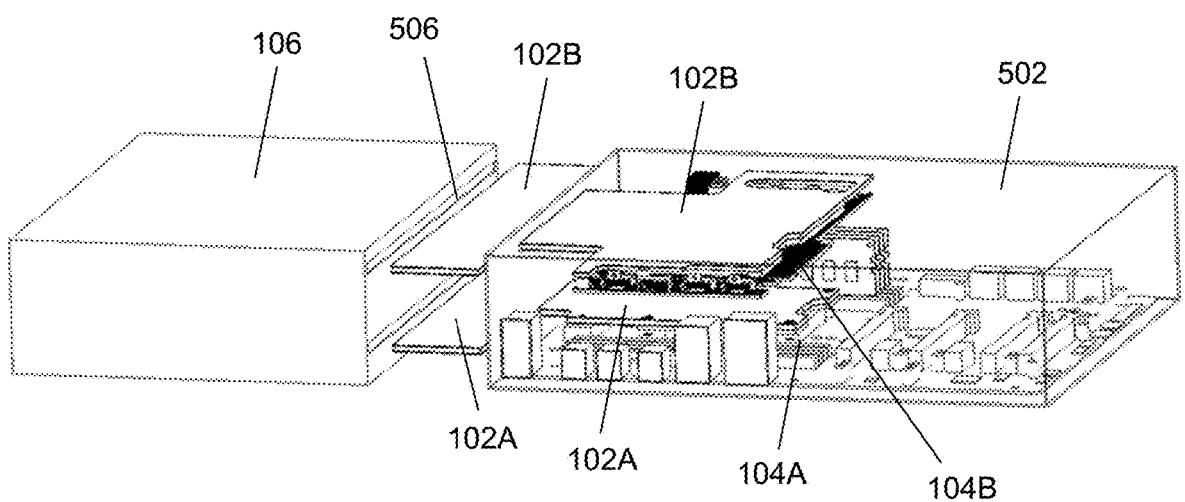

FIG. 5A depicts an exterior view of a non-limiting example of a computing system 100 in which modules 104 are stored within a module housing 502, while thermal bridges 102 associated with different modules 104 can extend out of the module housing 502 and into another housing for a cooling dock 106. As shown in FIG. 5A, the module housing 502 may have one or more openings 504 for electrical and/or data connections with other elements, as well as slots or other openings through which the thermal bridges 102 extend out of the module housing 502. FIG. 5B depicts a view of the modules 104A and 104B, and their associated thermal bridges 102A and 102B, that may be present within the module housing 502 shown in FIG. 5A.

As shown in FIG. 5B, the housing for the cooling dock 106 may also have slots 506 or other openings that allow thermal bridges 102 extending from the module housing 502 to be inserted into the cooling dock 106.

Figure 6A:
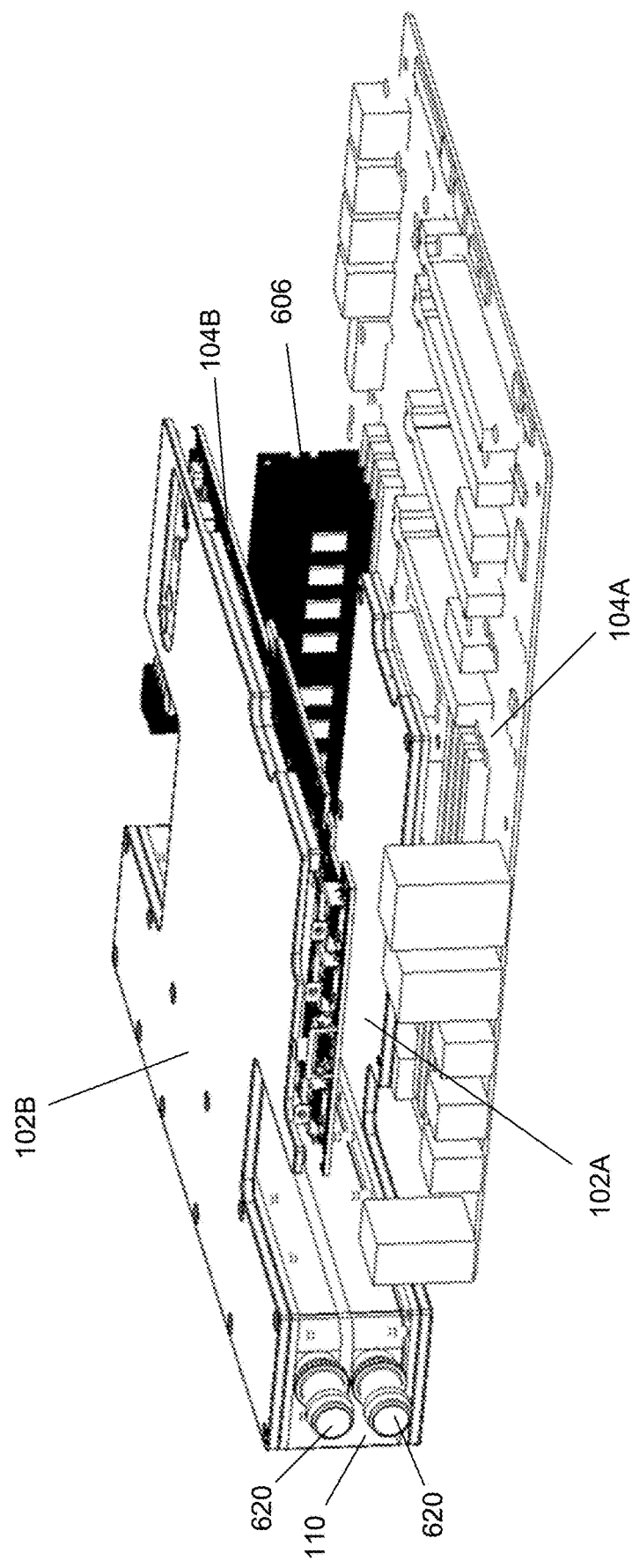
FIGS. 6A-6C depict a non-limiting example of an arrangement of modules with dedicated thermal bridges that extend to a cold plate.
Figure 6B:
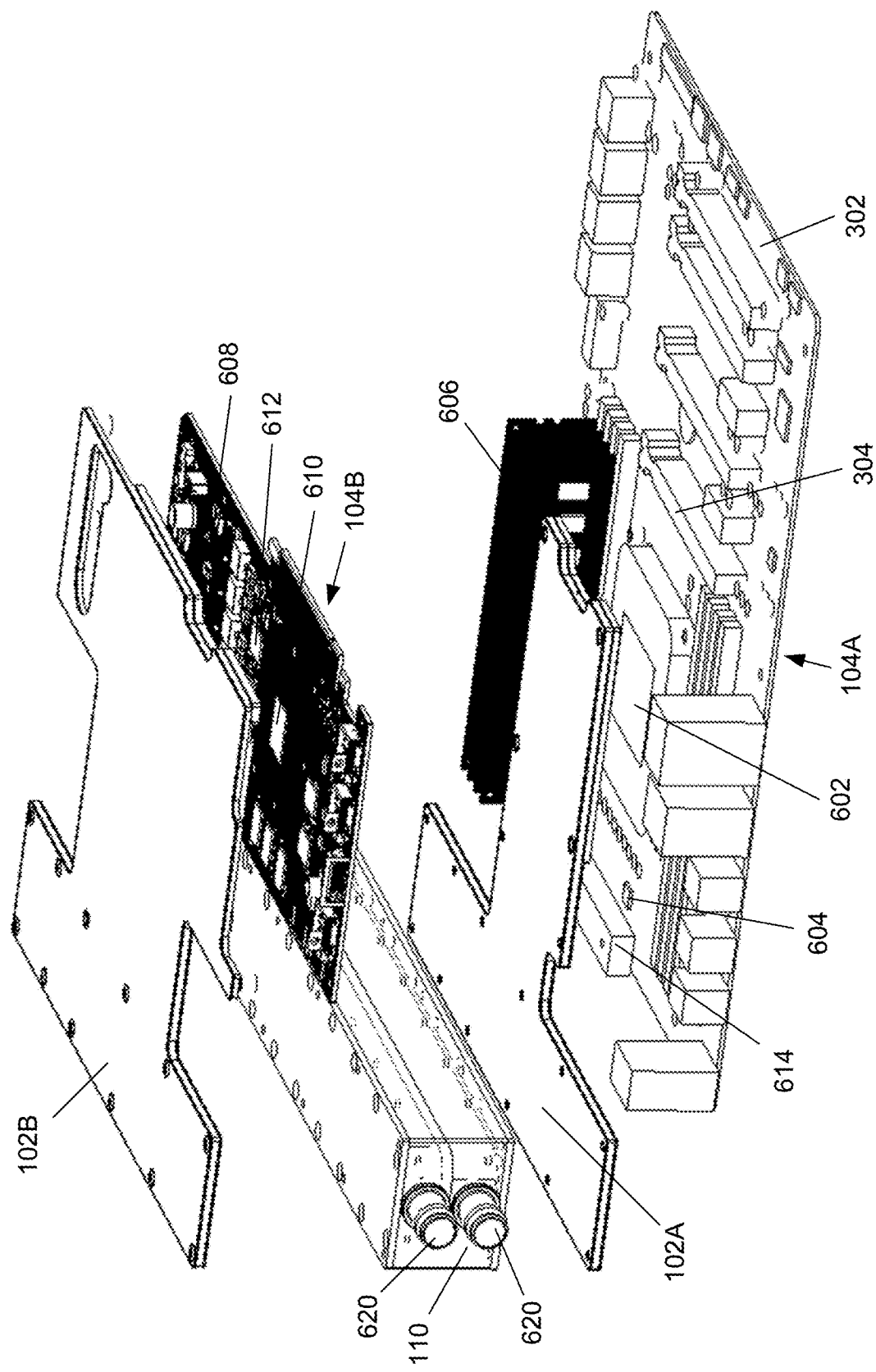
Figure 6C:
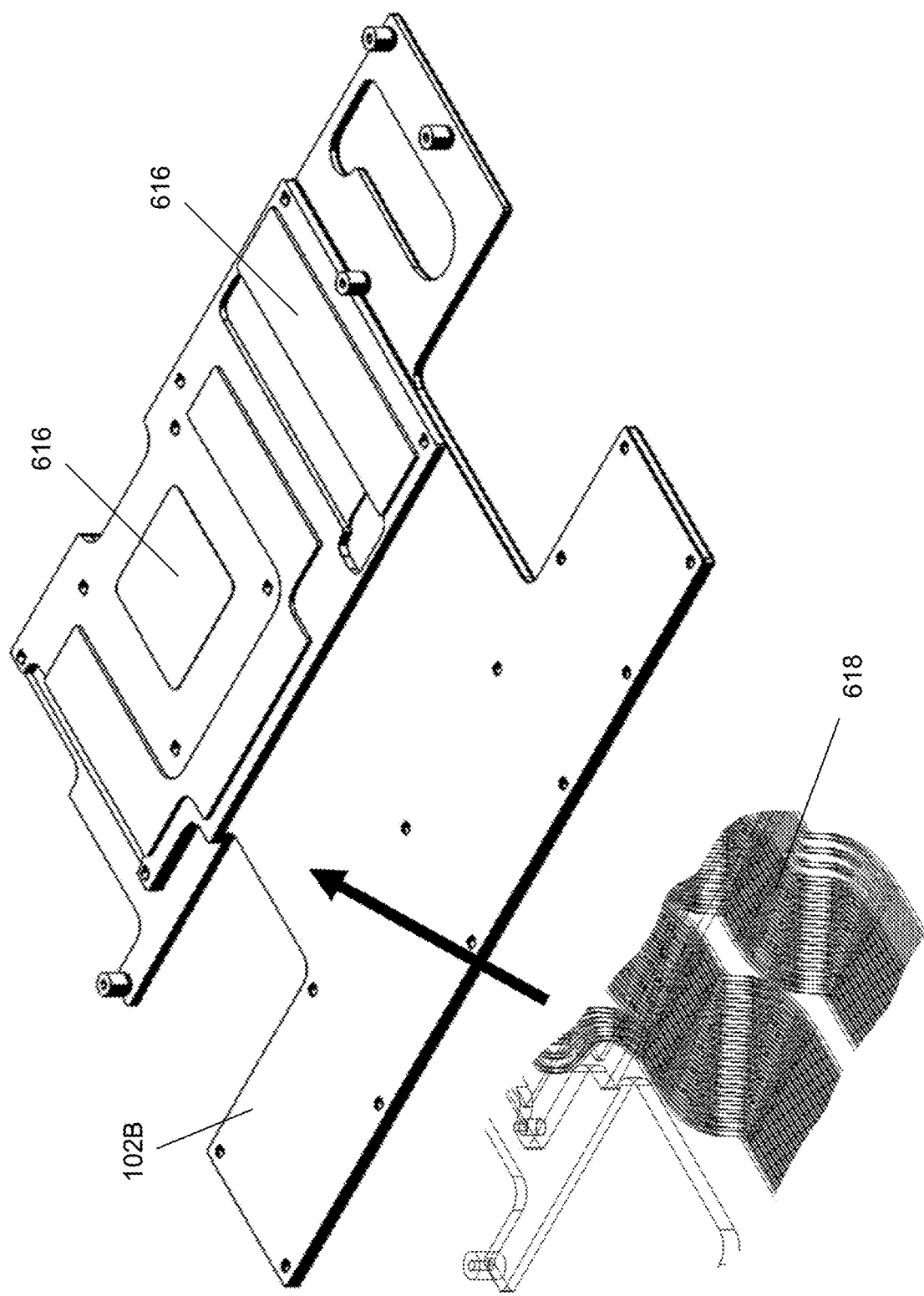

FIGS. 6A-6C depict a non-limiting example of an arrangement of modules 104 with dedicated thermal bridges 102 that extend to a cold plate 110. The cold plate 110 can be located within a cooling dock 106 (not shown) as described above. The example arrangement of modules 104 shown in FIGS. 6A-6C can be held within a module housing 502, for example, as shown in FIGS. 5A and 5B. FIG. 6A depicts an assembled view of the example arrangement of modules 104, while FIG. 6B depicts an exploded view of the example arrangement of modules 104. FIG. 6C depicts a bottom view of the second thermal bridge 102B shown in FIGS. 6A and 6B, along with a cutaway view of SOTS microchannels within the example second thermal bridge 102B.

In the example of FIGS. 6A-6C, a main module 104A can be a CPU module and another module 104B can be a GPU module. The CPU module 104A can include a motherboard 302, a CPU 602, a CPU VRM 604, and one or more modules of integrated or removable CPU memory 606. The GPU module 104B can include a GPU board 608, a GPU 610, and/or GPU memory/VRM 612. The GPU module 104B can be connected to the CPU module 104A using a peripheral connector 304 (not shown), such as a PCIe extender riser cable that connects PCIe goldfingers on the GPU board 608 to a PCIe slot on the motherboard 302 of the CPU module 104A.

A first thermal bridge 102A can be positioned against at least a portion of the CPU module 104A, such that heat generated by heat sources 108 of the CPU module 104A can be transferred into the first thermal bridge 102A. In this example, the CPU 602 can be a primary heat source 108 of the CPU module 104A, while the CPU VRM 604 and CPU memory 606 can be secondary heat sources 108 of the CPU module 104A. In some examples, TIMs can be present at contact areas between surfaces of such heat sources 108 and the first thermal bridge 102A, for example, on the underside of the first thermal bridge 102A.

A second thermal bridge 102B can be positioned against at least a portion of the GPU module 104B, such that heat generated by heat sources 108 of the GPU module 104B can be transferred into the second thermal bridge 102B. In this example, the GPU 610 can be a primary heat source 108 of the GPU module 104B, while the GPU memory/VRM 612 can be secondary heat sources 108 of the GPU module 104B. In some examples, TIMs can be present at contact areas between surfaces of such heat sources 108 and the second thermal bridge 102B, for example, on the underside of the second thermal bridge 102B.

In some examples, additional thermally conductive elements can be present to transfer heat between heat sources 108 and a thermal bridge 102, and/or a thermal bridge 102 can be fabricated in a shape designed to contact heat sources 108 of a particular module 104. For example, while the CPU 602 may directly contact the underside of the first thermal bridge 102A shown in FIGS. 6A and 6B, the CPU VRM 604 may be too short to directly contact the underside of the first thermal bridge 102A. However, as shown in FIG. 6B, a VRM contact block 614 made of a heat conducting material, such as solid aluminum, can be provided that is taller than the CPU VRM 604 and can directly contact the underside of the first thermal bridge 102A to transfer heat from the CPU VRM 604 to the first thermal bridge 102A. TIMs may also be present between the VRM contact block 614 and the first thermal bridge 102A to minimize thermal contact resistance, or a VRM contact block 614 can be directly soldered to, or fabricated as an extension of, the first thermal bridge 102A to minimize thermal contact resistance. As another example, FIG. 6C depicts the underside of the second thermal bridge 102B, which can be fabricated with contact surfaces 616 at elevations different from other surfaces of the second thermal bridge 102B that are specially configured to contact the GPU 610 and GPU memory/VRM 612 of the GPU module 104B.

Heat generated by the heat sources 108 of the CPU module 104A can be transferred via the first thermal bridge 102A to the cold plate 110, while heat generated by the heat sources 108 of the GPU module 104B can be transferred via the second thermal bridge 102B to the cold plate 110. For example, an extension of the first thermal bridge 102A can be positioned against a bottom surface of the cold plate 110, while an extension of the second thermal bridge 102B can be positioned against a top surface of the cold plate 110 as shown in FIGS. 6A and 6B, such that heat from both thermal bridges 102 can be transferred into the cold plate 110. In some examples, as shown in the cutaway portion of FIG. 6C, a thermal bridge 102 can include SOTS microchannels 618, which can be a network of capillaries holding a two-phase working fluid configured to transfer heat through the thermal bridge 102 from TEA nodes near heat sources 108 to TED nodes where the heat can be transferred to the cold plate 110. In some examples, TIMs can be present at contact areas between surfaces of such thermal bridges 102 and the cold plate 110.

As discussed above, liquid coolant can pass through a fluid path 112 of the cold plate 110 to transfer heat away from the cold plate 110 to other portions of the cooling dock 106 where the heat can be dissipated. Accordingly, as shown in FIGS. 6A and 6B, the cold plate 110 can have inlet/outlet ports 620 where tubing 202 (see, e.g., FIG. 2) of the cooling dock 106 can connect via quick-disconnect fittings, open fluid connections, or other types of connections.

Figure 7A:
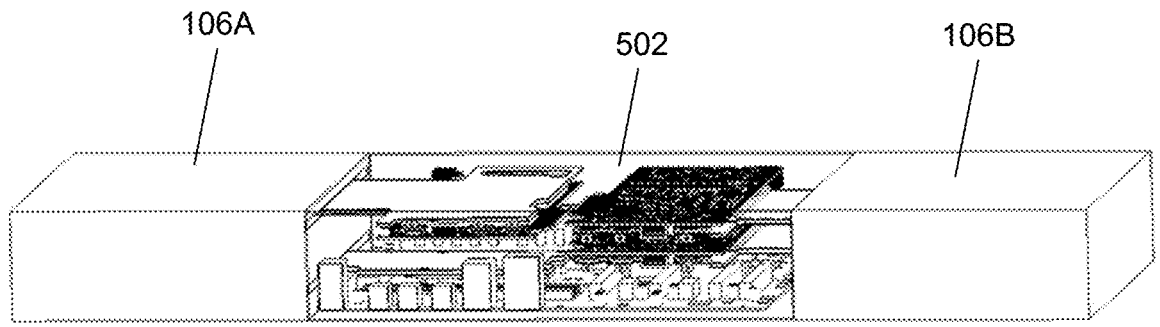
FIGS. 7A and 7B depict views of a first non-limiting example of a computing system in which thermal bridges associated with different modules can extend out of a module housing into multiple cooling docks.
Figure 7B:
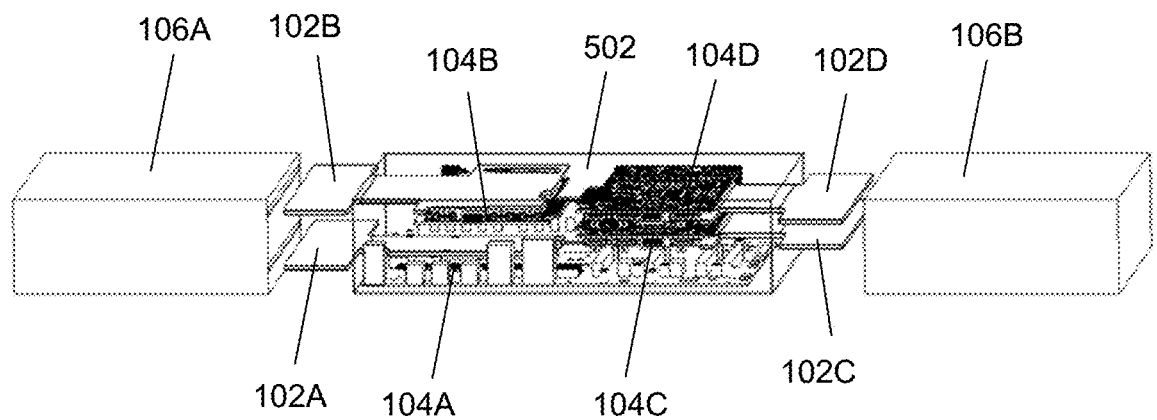

FIGS. 7A and 7B depict views of a first non-limiting example of a computing system 100 in which thermal bridges 102 associated with different modules 104 can extend out of a module housing 502 into multiple cooling docks 106. In some examples, separate cooling docks 106 can be present in a computing system 100 that can accept thermal bridges 102 of different modules 104. In some examples, separate cooling docks 106 can be added or removed, such that the cooling capacity of the computing system 100 can be expandable or adjustable. For example, if additional add-on modules 104C and 104D are added to the example shown in FIGS. 5A and 5B, a second cooling dock 106 can be added to the computing system 100 as shown in FIGS. 7A and 7B to accommodate thermal bridges 102C and 102D of the additional add-on modules 104C and 104D. However, in other examples a single cooling dock 106 may have enough connectors for four add-on modules 104, or any other number of add-on modules.

Figure 8A:
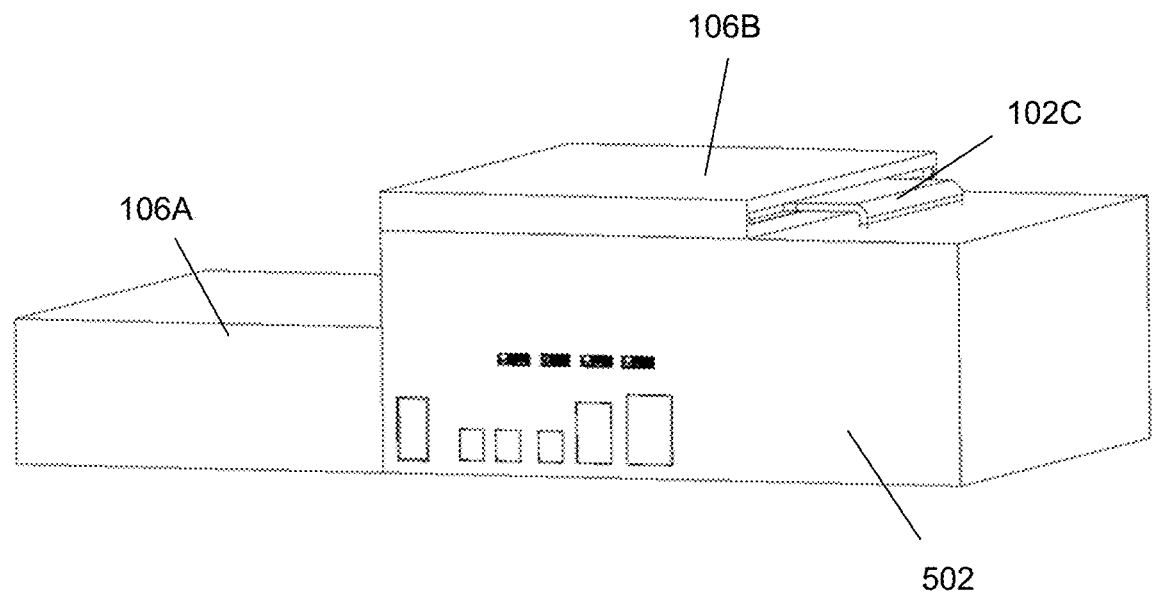
FIGS. 8A and 8B depict views of a second non-limiting example of a computing system in which thermal bridges associated with different modules can extend out of a module housing into multiple cooling docks.
Figure 8B:
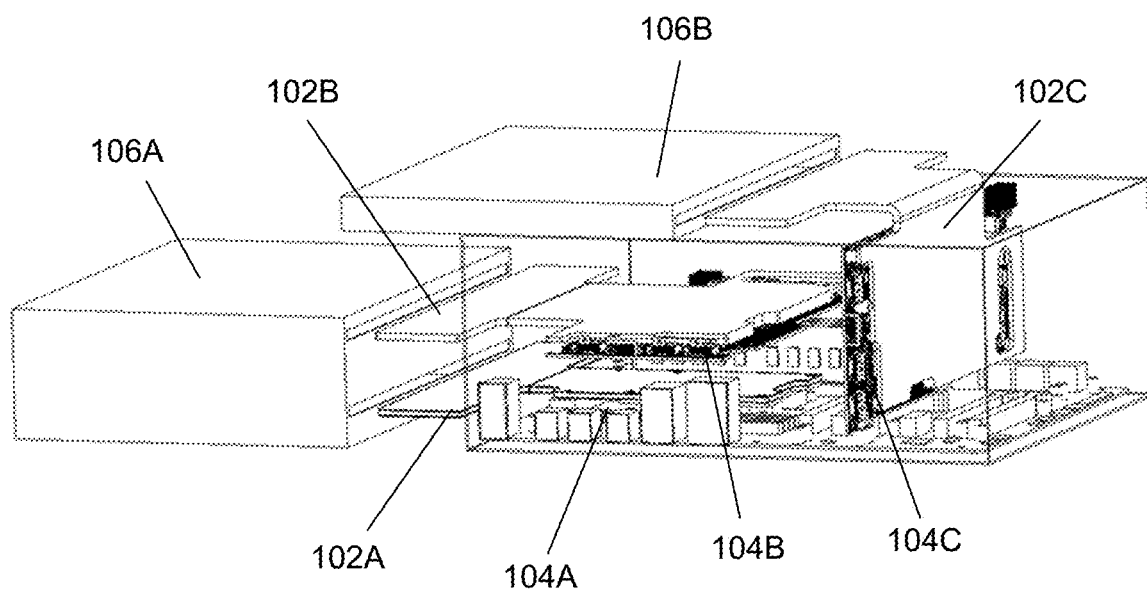

FIGS. 8A and 8B depict views of a second non-limiting example of a computing system 100 in which thermal bridges 102 associated with different modules 104 can extend out of a module housing 502 into multiple cooling docks 106. Although the example of FIGS. 7A and 7B depict separate cooling docks 106 positioned on opposite ends of a housing 502 that holds modules 104, separate cooling docks 106 can be located at any desired position within the computing system 100. For instance, in the example of FIGS. 8A and 8B, horizontally-oriented modules 104, such as a main module 104 with a motherboard 302 and a GPU module 104B can have thermal bridges 102 that extend horizontally into a first cooling dock 106A. However, in this example, a third module 104C can extend vertically from a peripheral connector 304 on the motherboard 302, and a thermal bridge 102C extending from the third module 104C can have a bent L-shaped configuration, such that the thermal bridge 102C extends to a second cooling dock 106B positioned at the top of the computing system 100. In some examples, one or more vertical modules 104 can accordingly have bent L-shaped thermal bridges 102 that can connect to one or more slots 506 of the second cooling dock 106B positioned at the top of the computing system 100

Figure 9A:
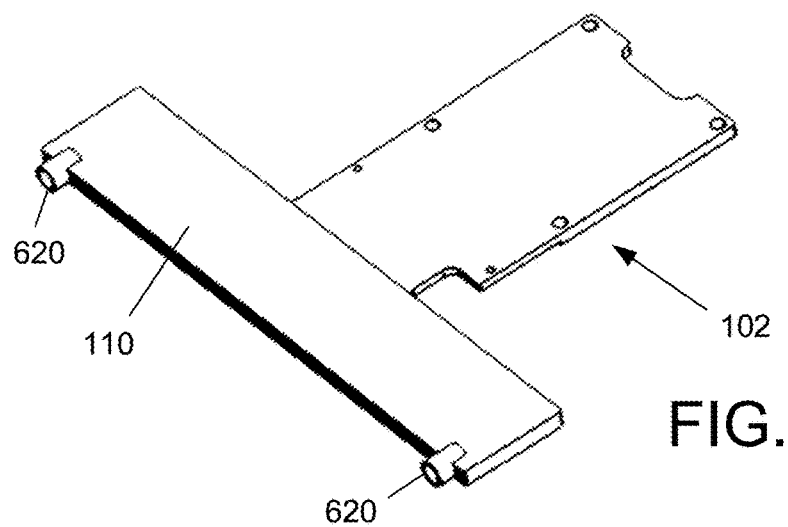
FIGS. 9A-9D depict an example of a thermal bridge with an integrated cold plate.
Figure 9B:
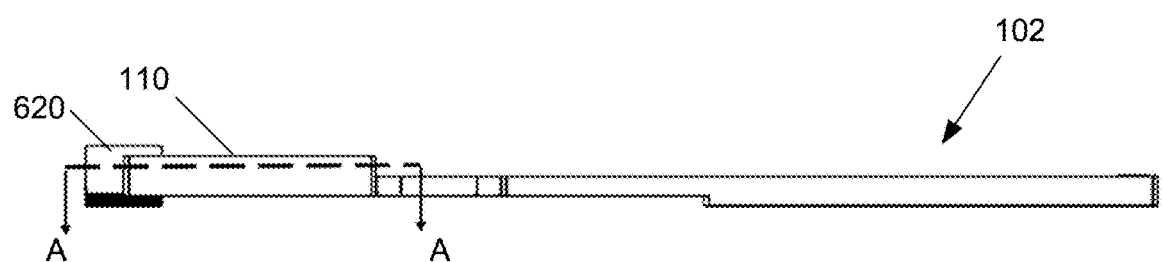
Figure 9C:
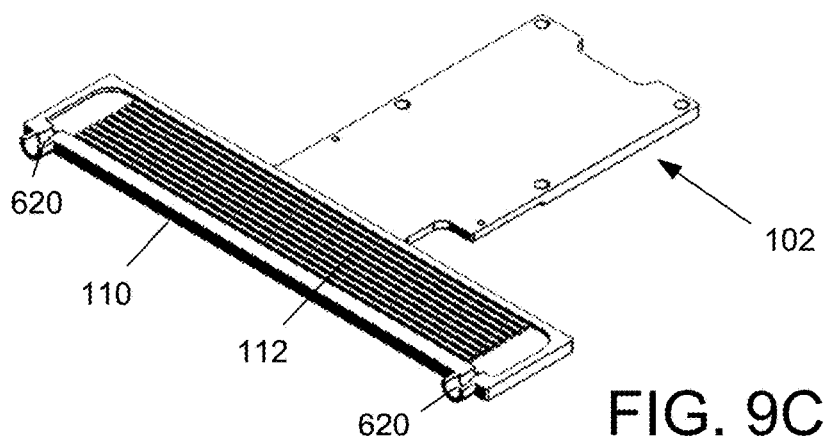
Figure 9D:
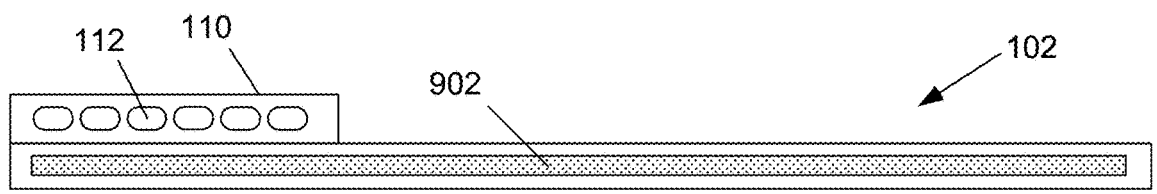

FIGS. 9A-9D depict an example of a thermal bridge 102 with an integrated cold plate 110. FIGS. 9A and 9B depict perspective and side views of the thermal bridge 102. FIG. 9C depicts a cut-out view of the integrated cold plate 110 along line A-A of FIG. 9B, while FIG. 9D depicts a cross section of the thermal bridge 102. In this example, the thermal bridge 102 can include an integrated cold plate 110 having one or more fluid paths 112. The integrated cold plate 110 can have inlet/outlet ports 620 that can connect to tubing 202 of a cooling dock 106, for example, as described above. The inlet/outlet ports 620 can also be in fluid communication with the inlet/outlet ports 620, such that liquid coolant can flow through tubing 202 and/or other elements of the cooling dock 106 and through the fluid paths 112 of the integrated cold plate 110. As described above, connections between the tubing 202 and inlet/outlet ports 620 can include quick-disconnect couplings, open fluid connections, and/or other types of connections.

The thermal bridge 102 can also include a heat transfer element 902 configured to transfer heat along the thermal bridge 102 from one or more heat absorption locations toward the integrated cold plate 110. The heat transfer element 902 can include an SOTS microchannel network, a heat pipe, a vapor chamber, and/or other heat transfer element. The heat transfer element 902 can accordingly transfer heat generated by one or more heat sources 108 of a module 104 to the integrated cold plate 110 of the thermal bridge 102, where liquid coolant flowing through and out of the integrated cold plate 110 via an outlet port 620 can transfer the heat away from the thermal bridge 102 and the integrated cold plate 110.

The thermal bridge 102 can have a solid body, such as metal, that encloses the heat transfer element 902 and the fluid paths 112 of the integrated cold plate 110. In some examples, the inner structures for the heat transfer element 902 and/or the fluid paths 112 can be pre-machined on a solid body, and then be enclosed by one or more processes, such as vacuum brazing, atmosphere-controlled brazing, vacuum diffusion bonding, laser welding, electrical beam welding, friction welding, electrical resistance diffusion bonding, ultrasonic soldering, and/or other fabrication methods.

In some examples, a thermal bridge 102 fabricated with an integrated cold plate 110 as described herein with respect to FIGS. 9A-9D can have a shorter height relative to a combination of a separate thermal bridge 102 and a cold plate 110, which can allow integrated cold plate 110 versions to have a more compact form factor. In some examples, the integration of the cold plate 110 can also assist with reducing thermal contact resistance between a thermal bridge 102 and a cold plate 110. However, in other examples where the thermal bridge 102 and a cold plate 110 are separate, other steps can be taken to reduce thermal contact resistance between the elements, such as by applying TIMs to contact surfaces.

Figure 10:
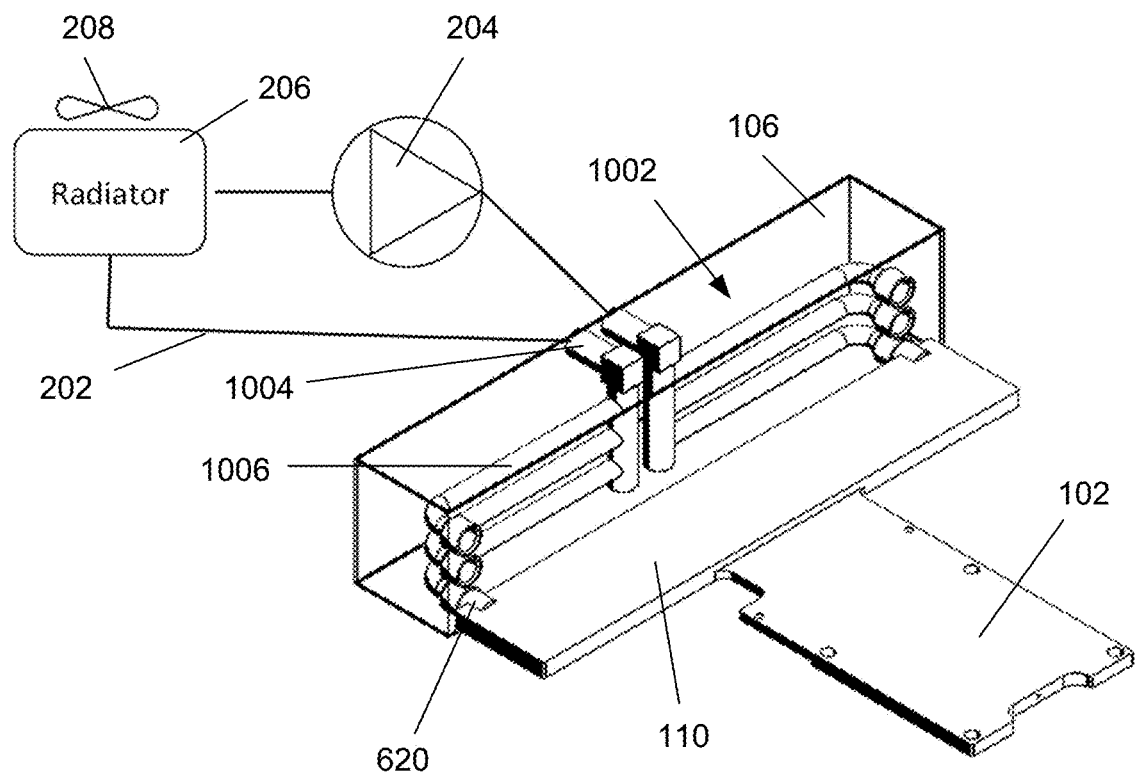
FIG. 10 depicts an example of a cooling dock that can accept multiple thermal bridges with integrated cold plates.

FIG. 10 depicts an example of a cooling dock 106 that can accept multiple thermal bridges 102 with integrated cold plates 110, for example, as shown in FIGS. 9A-9D. In the example of FIG. 10, the cooling dock 106 can include a manifold 1002 that can connect to inlet/out ports 620 of integrated cold plates 110 of multiple thermal bridges 102. The manifold 1002 can include its own fluid ports 1004 that can connect through piping sets 1006 to the inlet/out ports 620 of the integrated cold plates 110. Tubing 202 can connect the fluid ports 1004 of the manifold 1002 to other elements of the cooling dock 106, such as a pump 204, a radiator 206, and/or a fan system 208 including one or more fans. Accordingly, liquid coolant can flow through the tubing 202 into a fluid port 1004 of the manifold 1002, into one or more piping sets 1006, into connected fluid paths 112 of integrated cold plates 110 of one or more thermal bridges 102 via ports 620, and back out of the integrated cold plates 110 through the piping sets 1006 and into the tubing 202 where heat can be dissipated. In some examples, the manifold 1002 can accordingly cause liquid coolant to flow through integrated cold plates 110 of multiple thermal bridges 102, thereby assisting with cooling multiple modules 104.

Connections between the ports 620 of the integrated cold plates 110 and the piping sets 1006 of the manifold 1002 can use quick-disconnect couplings, open fluid connections, and/or any other type of connection. In some examples in which open fluid connections are used, dripping or leakage may occur when connecting or disconnecting thermal bridges 102 with integrated cold plates 110 from the manifold 1002. Accordingly, the connections can be located within a housing of the cooling dock 106 or elsewhere outside housings of the modules 104 in order to protect electronic components of the modules 104 from spilled liquid coolant.

Many of the examples described above have separate or integrated cold plates 110 positioned within a cooling dock 106 due to extensions of thermal bridges 102 extending from modules 104 into the cooling dock 106. However, in other examples, cooling assemblies can be provided that have cold plates 110 positioned at or integrated within individual modules 104, with tubing 202 connecting ports of those cold plates to separate cooling docks 106 that have elements, such as pumps 204, radiators 206, and/or fan systems 208. Accordingly, multiple modules 104 may be associated with different dedicated cooling assemblies with distinct thermal bridges 102 and cold plates 110.

Figure 11A:
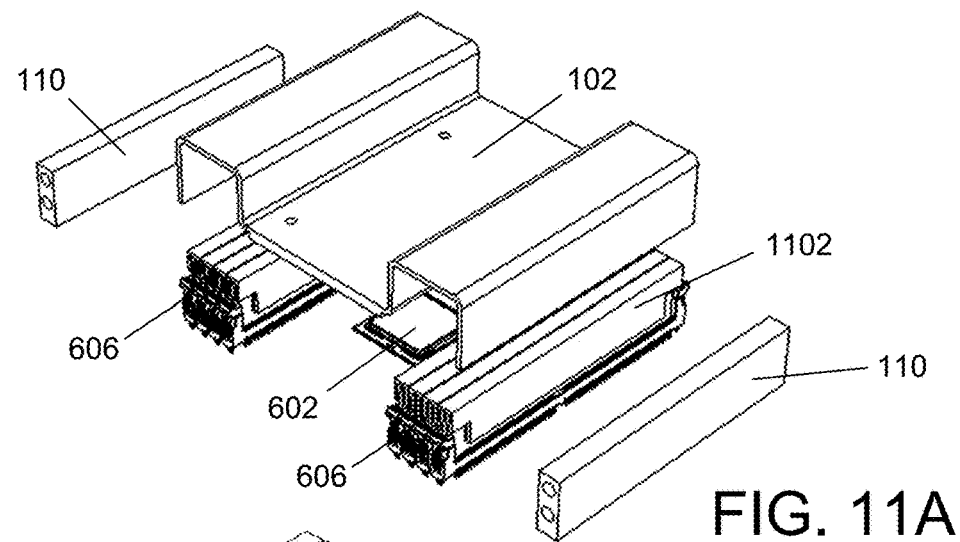
FIGS. 11A-11D depict views of elements of a first example cooling assembly in which a thermal bridge has a form factor configured to fit around one or more heat sources of a module.
Figure 11B:
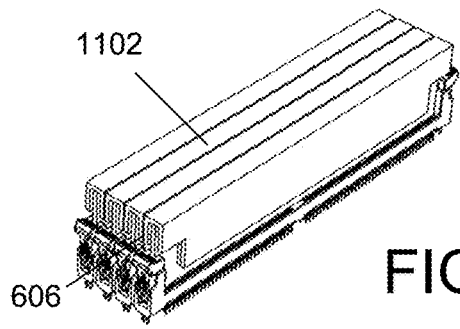
Figure 11C:
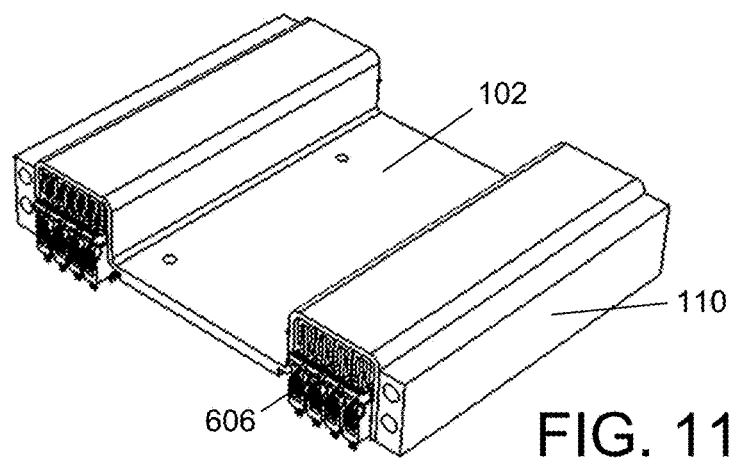
Figure 11D:
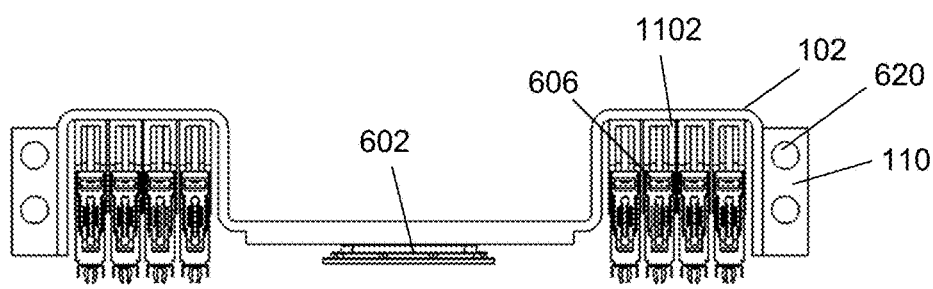

FIGS. 11A-11D depict views of elements of a first example cooling assembly in which a thermal bridge 102 has a form factor configured to fit around one or more heat sources 108 of a module 104. As shown in FIG. 11A, a module 104 can have multiple heat sources 108, such as a CPU 602, CPU VRMs 604, and sets of memory 606. The sets of memory 606 can have a different height than the CPU 602 and/or CPU VRMs 604. Accordingly, a thermal bridge 102 can be provided that has a lower flat section configured to be positioned against the CPU 602 and/or CPU VRMs 604, as well as one or more non-planar wing sections configured to go up and over the sets of memory 606.

Such a non-planar thermal bridge 102 can be a heat spreader with one or more heat transfer elements, such as a SOTS network, a vapor chamber, or an oscillating heat pipe, that can transfer heat away from the multiple heat sources 108 to surfaces of the non-planar wing sections that contact one or more cold plates 110. For instance, in the example of FIGS. 11A-11D, separate cold plates 110 can be provided on opposing ends of the non-planar thermal bridge 102 against the non-planar wing sections. The non-planar shape of this example thermal bridge 102 can allow a single thermal bridge 102 to transfer heat generated by the CPU 602, CPU VRMs 604, and sets of memory 606 to one or more cold plates 110, while being compact and adding minimal height to the module 104. In this example, the cold plates 110 may be located apart from the cooling dock 106 as part of a cooling assembly for the module 104, but be connected to tubing 202 of a cooling dock 106 via ports 620.

In some examples, the sets of memory 606 can be covered by a cover 1102, such as a metal clip with a top flat section, where a thermal pad or other TIMs can be applied at contact areas between surfaces of the cover 1102 and the underside of the non-planar wing sections. In some examples, TIMs may also be applied at contact areas between surfaces of the thermal bridge and other heat sources 108 and/or the cold plates 110. In some examples, the thermal bridge 102 may have pin holes positioned at standoffs pre-placed on a motherboard 302 or PCB for assembling thermal modules to the CPU 602.

Figure 12A:
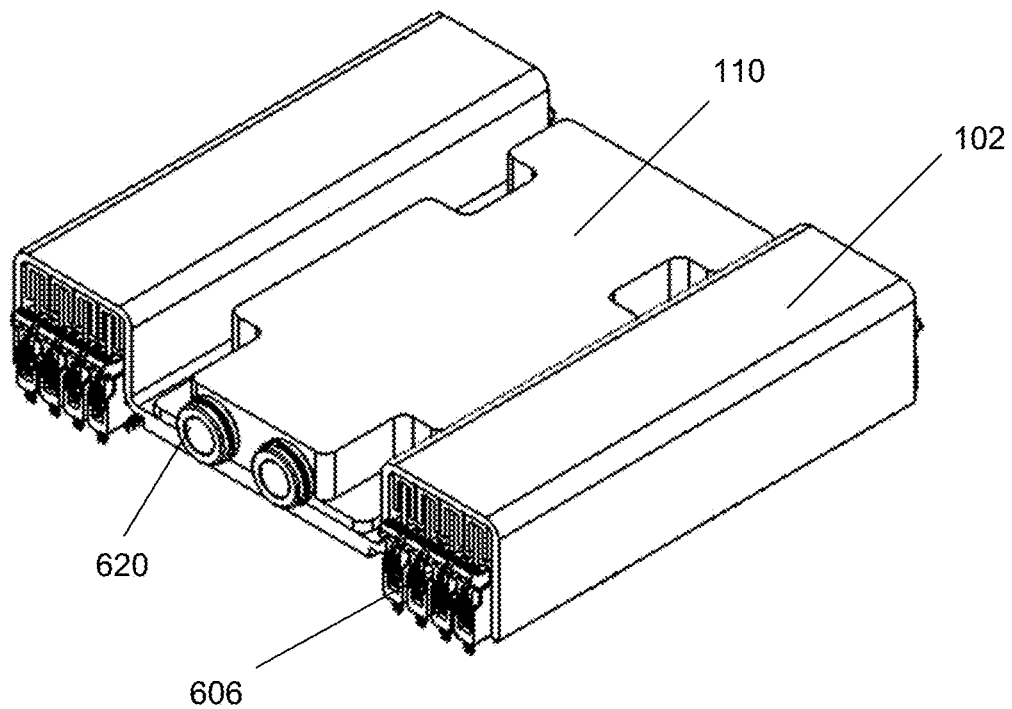
FIGS. 12A and 12B depict a second example cooling assembly, in which a single cold plate can be positioned between non-planar wing sections of the thermal bridge.
Figure 12B:
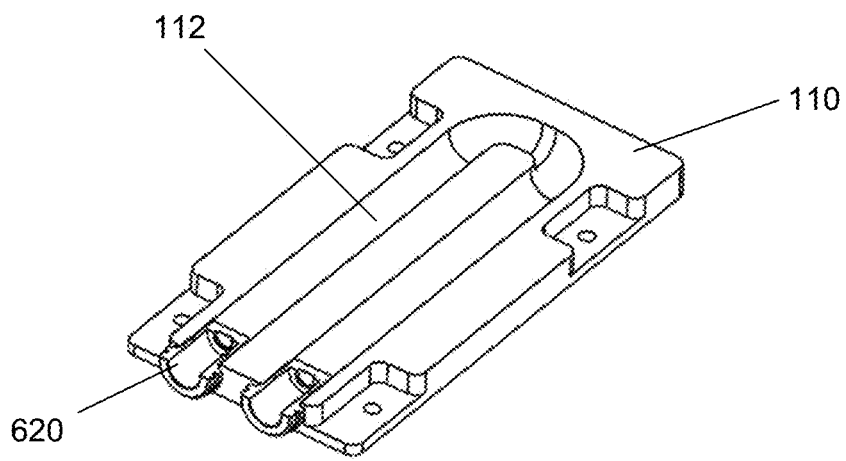

FIGS. 12A and 12B depict a second example cooling assembly, in which a single cold plate 110 can positioned between the non-planar wing sections of the thermal bridge 102 instead of the separate cold plates 110 on opposing sides of the thermal bridge 102, for example, as shown in FIGS. 11A-11D. FIG. 12B depicts a cut-out view showing the fluid path 112 inside the cold plate 110 of FIG. 12A. In this example, the cold plates 110 may be located apart from the cooling dock 106 as part of a cooling assembly for the module 104, but be connected to tubing 202 of a cooling dock 106 via ports 620. In some examples, TIMs can be applied between the thermal bridge 102 and the cold plate 110. Here, because the CPU 602 may in some cases generate more heat than the memory 606, positioning the cold plate 110 closer to the CPU 602 may allow the cold plate 110 to cool the CPU 602 efficiently, due to a large surface area of the contact area between surfaces of the cold plate 110 and the thermal bridge 102, while still allowing the thermal bridge 102 to transfer heat from the sets of memory 606 to the central cold plate 110. Heat transferred by the thermal bridge 102 can be transferred away via the liquid fluid passing through the fluid path 112 of the cold plate 110. In some examples, the ports 620 of the cold plate 110 can use quick-disconnect fittings that reduce the risk of spillage of the liquid coolant due to the proximity of the cold plate 110 to the CPU 602. As shown in FIG. 12B, mounting holes in the cold plate 110 can also be provided at the same, or different, positions than pin holes in the thermal bridge 102 to connect the cold plate 110 to the thermal bridge 102 and/or PCB.

Figure 13A:
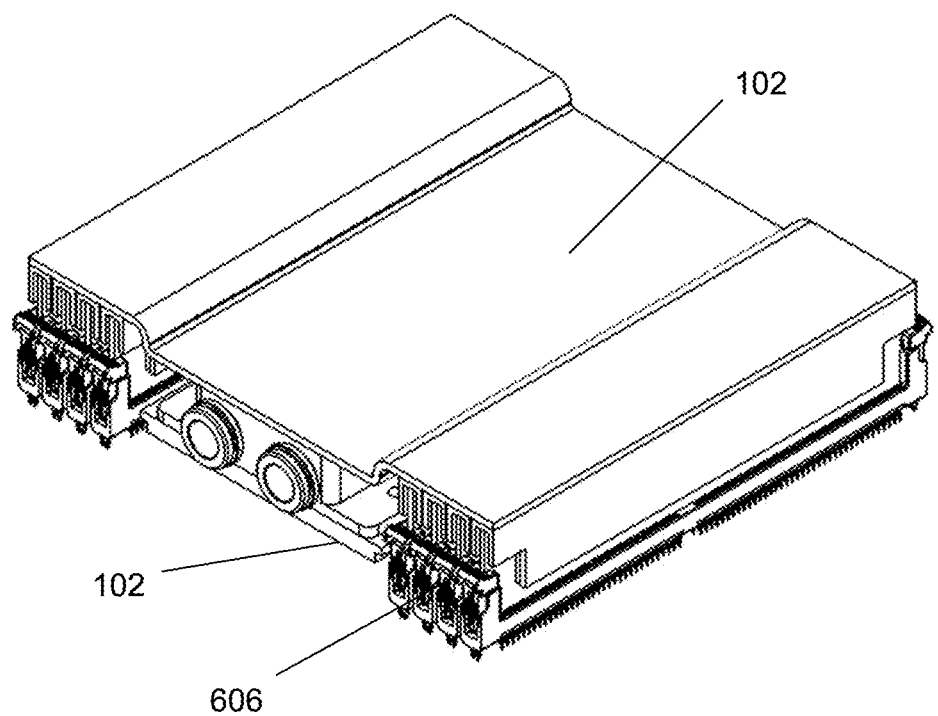
FIGS. 13A and 13B depict a third example cooling assembly, in which a cold plate can be positioned between two thermal bridges.
Figure 13B:
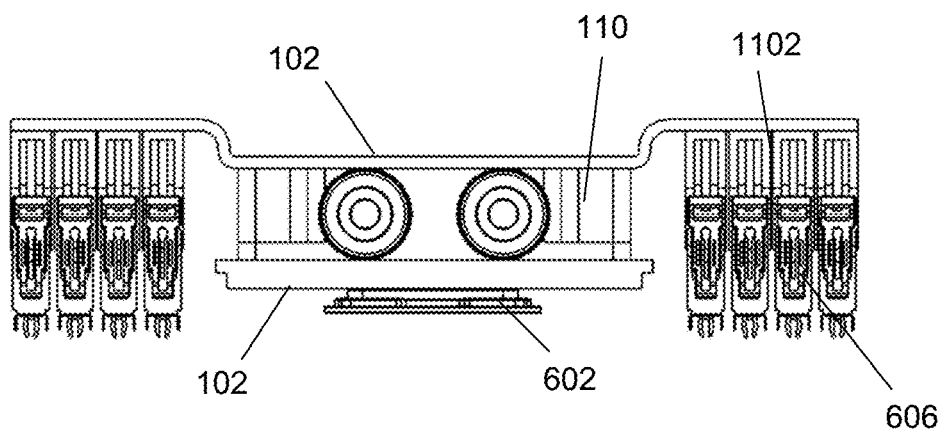

FIGS. 13A and 13B depict a third example cooling assembly, in which a cold plate 110 can be positioned between two thermal bridges 102. For example, a first planar thermal bridge 102 can be positioned between the cold plate 110 and heat sources 108, such as a CPU 602 and/or CPU VRMs 604, while a second non-planar thermal bridge 102 can be positioned above the cold plate 110 and extend above and/or around sets of memory 606. Each of the two thermal bridges 102 can transfer heat from corresponding heat sources 108 to the cold plate 110 positioned between them.

Figure 14A:
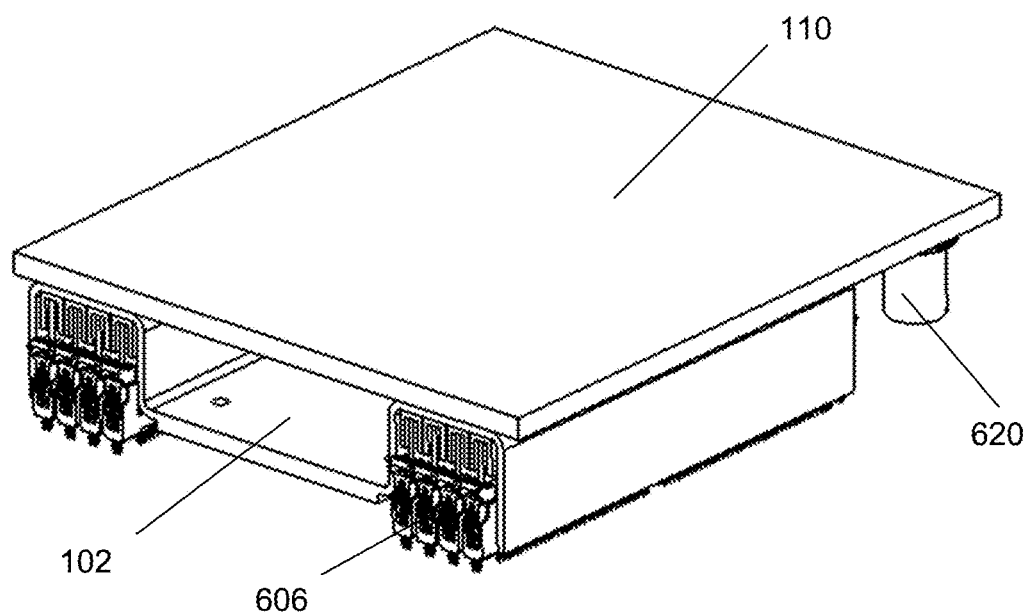
FIGS. 14A and 14B depict a fourth example cooling assembly, in which a non-planar thermal bridge connects to a planar cold plate that extends beyond the non-planar thermal bridge.
Figure 14B:
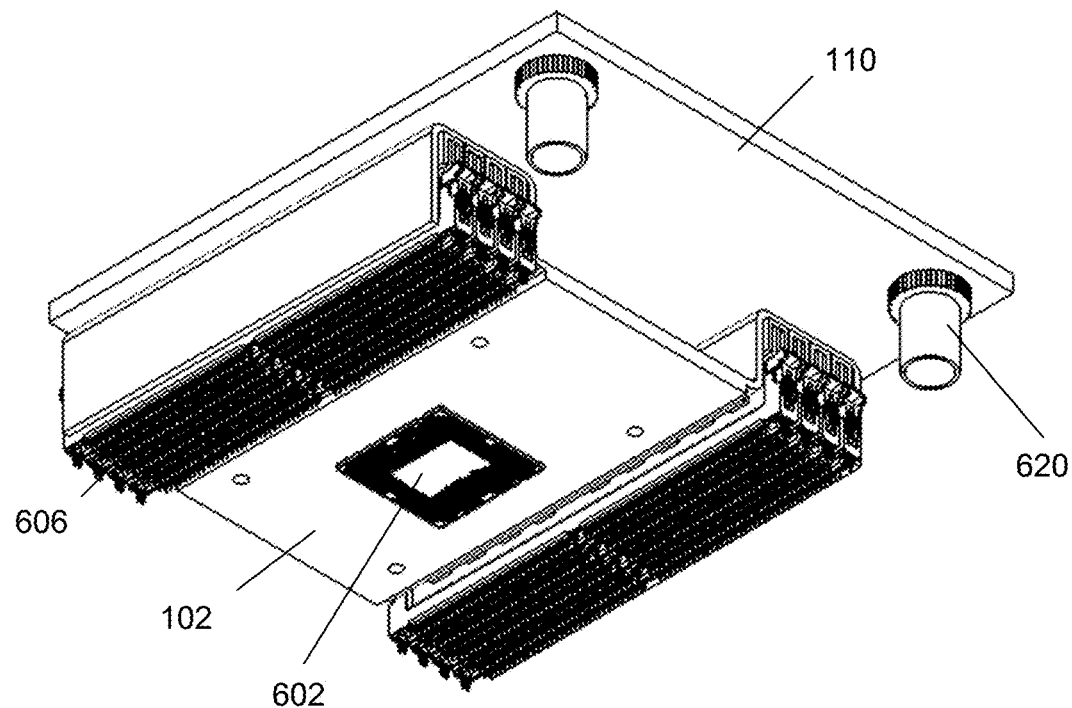

FIGS. 14A and 14B depict a fourth example cooling assembly, in which a non-planar thermal bridge 102 connects to a planar cold plate 110 that extends beyond the non-planar thermal bridge 102. In the example of FIGS. 14A and 14B, non-planar wing sections of the non-planar thermal bridge 102 can be in thermal contact with the planar cold plate 110. Although not shown, similar non-planar thermal bridges 102 for a GPU module 104 or other modules 104 can also be present and have their wing sections shaped to thermally contact the planar cold plate 110. Ports 620 in the planar cold plate 110 can connect to tubing 202 of a cooling dock 106, such that liquid coolant can pass from the planar cold plate 110 to other elements of a cooling dock 106, such as a pump 204, a radiator 206, and/or a fan system 208 including one or more fans. In some examples, spaces between the planar cold plate 110 and the thermal bridges 102 or modules 104 can be used to route cabling or to hold peripheral devices 310, such as a hard drive or solid-state drive, thereby reducing the overall dimensions of the computing system 100.

Figure 15A:
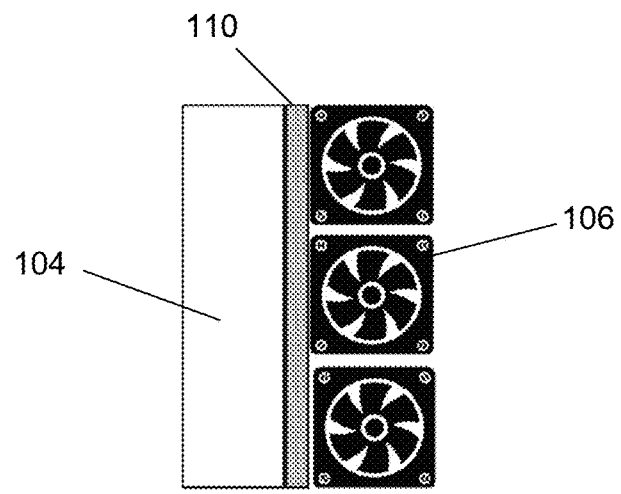
FIGS. 15A and 15B depict additional examples of arrangements for cooling assemblies having modules of electronic components, at least one cold plate, and one or more cooling docks.
Figure 15B:
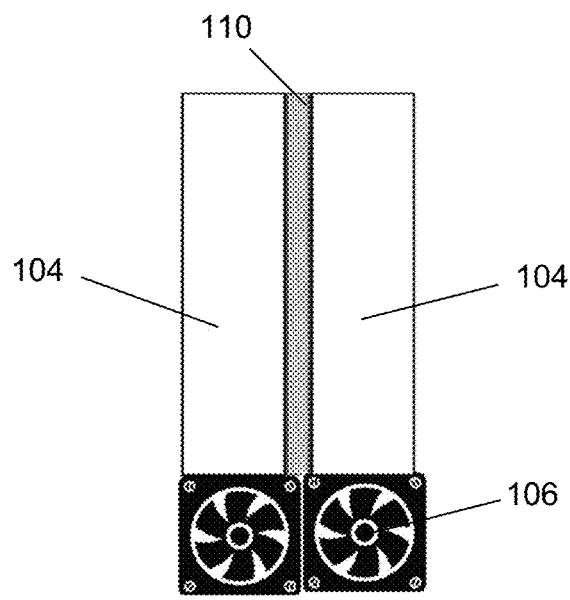

FIGS. 15A and 15B depict additional examples of arrangements for cooling assemblies having modules 104 of electronic components, at least one cold plate 110, and one or more cooling docks 106. For example, a cold plate 110 can be positioned between modules 104 and one or more cooling docks 106, as shown in FIG. 15A, or a cold plate 110 may thermally connect modules 104 to cooling docks 106 positioned adjacent to the modules 104, as shown in FIG. 15B.

Figure 16A:
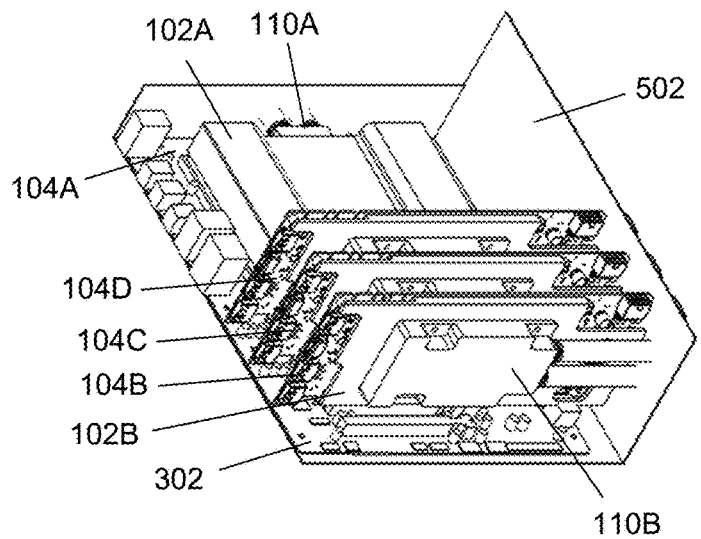
FIGS. 16A-16F depict views and elements of an example of a computing system 100 that can include multiple modules, each with dedicated cooling assemblies having distinct thermal bridges and cold plates.
Figure 16B:
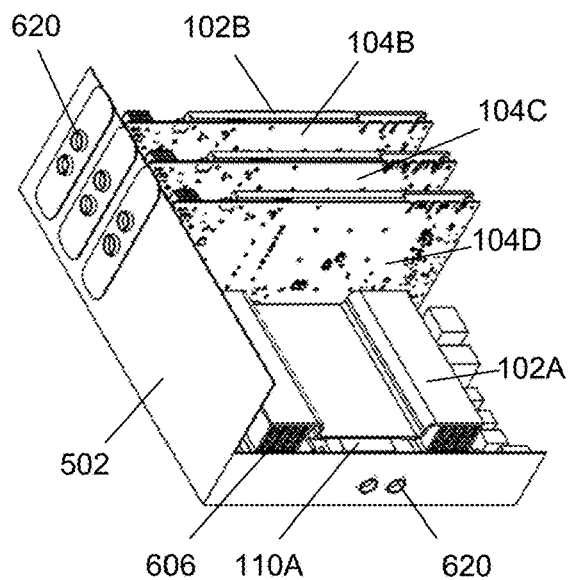
Figure 16C:
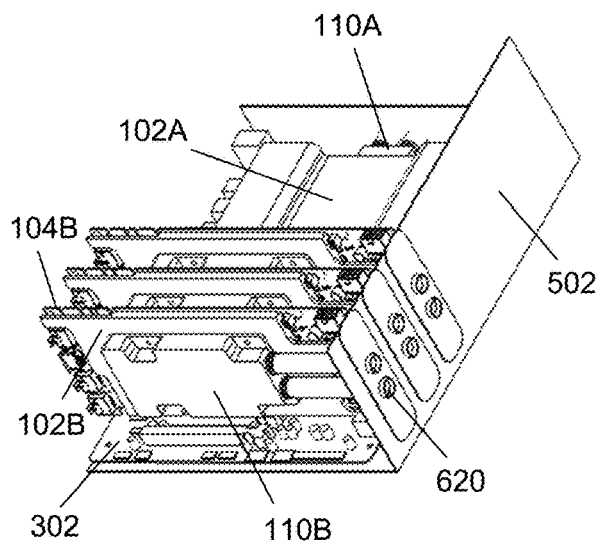
Figure 16D:
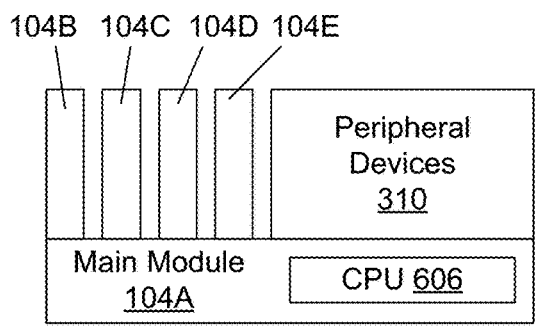
Figure 16E:
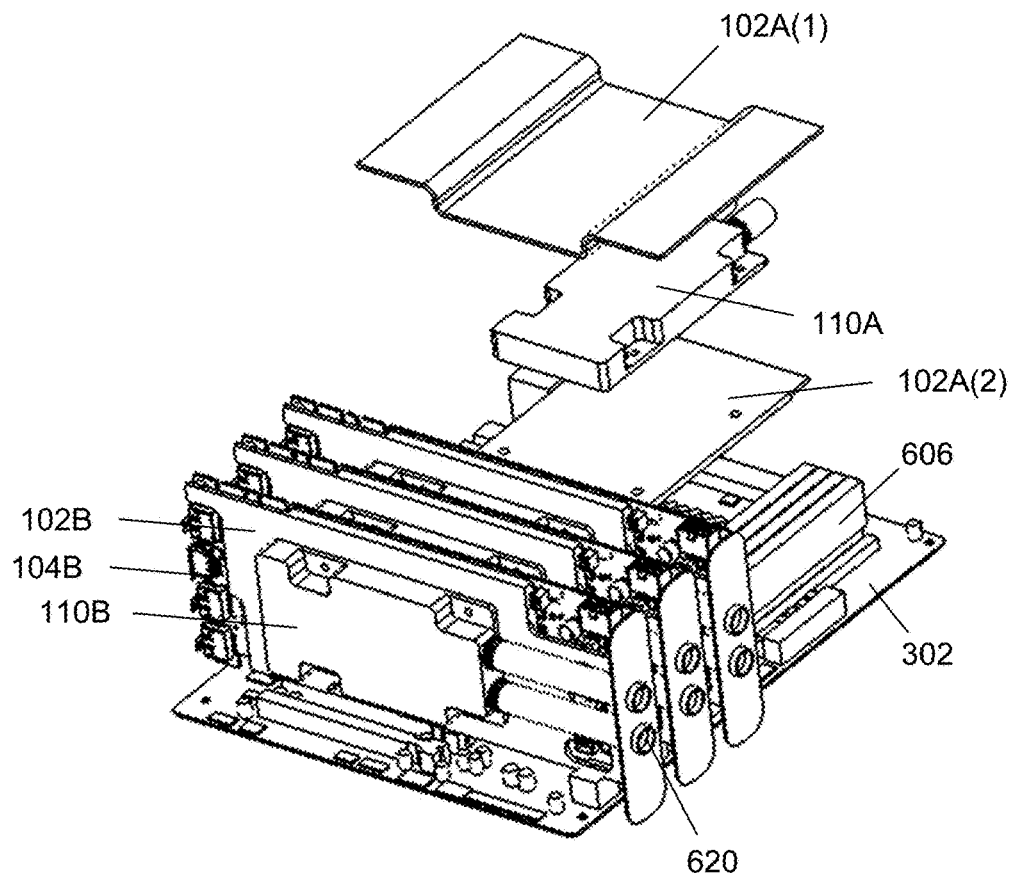
Figure 16F:
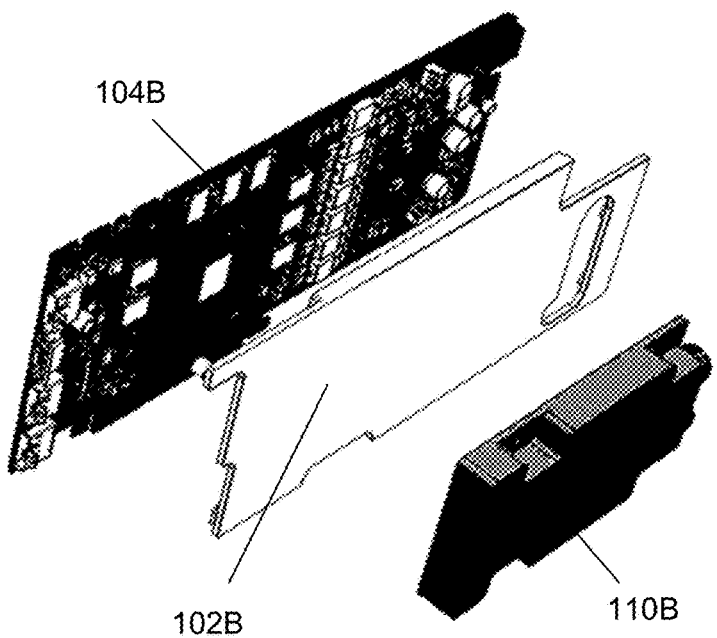

FIGS. 16A-16C depict three perspective views an example of a computing system 100 that can include multiple modules 104 each with dedicated cooling assemblies having distinct thermal bridges 102 and cold plates 110. FIG. 16D is a diagram of an example arrangement of such modules 104 in the computing system 100. FIG. 16E depicts a partial view of the example of FIGS. 16A-16C, with an exploded view of a cooling assembly for a main module 104A. FIG. 16F depicts an exploded view of a cooling assembly for an add-on module 104B of the example of FIGS. 16A-16C. Although a cooling dock 106 is not shown in FIGS. 16A-16F, ports 620 of the cold plates 110 within each of the different cooling assemblies can be connected to a cooling dock 106 via tubing 202 or other connectors, such that liquid coolant can pass through the various cold plates 110.

In the example of FIGS. 16A-16F, a main module 104A can have motherboard 302, such as an ATX motherboard, to which a CPU 602, VRM 604, memory 606, and/or other elements can be attached. Other add-on modules 104, such as a GPU module 104B, can be attached to the motherboard 302. For example, a GPU module 104B can be vertically plugged into a PCIe slot in the motherboard 302 of the main module 104A. In some examples, one or more add-on modules 104 with dedicated cooling assemblies can be positioned above a first portion of a horizontal main module 104A within a housing 502, while space above a second portion of the horizontal main module 104A, for instance above a CPU 602, can be reserved within the housing 502 for other peripheral devices 310, such as a power supply (PWS), storage devices, optical drives, or other peripherals. For example, FIG. 16D depicts an example of such an arrangement of components in a computing system 100.

In the example of FIGS. 16A-16F, individual modules 104, such as the main module 104A, a GPU module 104B, and/or other add-on modules 104, can each have dedicated cooling assemblies. A dedicated cooling assembly for a particular module 104 can include one or more dedicated thermal bridges 102 in thermal contact with one or more heat sources 108 of the module, and one or more dedicated cold plates 110 in thermal contact with the one or more dedicated thermal bridges 102 for the module 104. The designs and configurations of the cooling assemblies and their components can vary depending on the shape and/or design of the module 104 and its heat sources 108. For example, as shown in FIG. 16E, a cooling assembly for the main module 104A can be similar to the cooling assembly shown in FIGS. 13A and 13B, with a single cold plate 110 positioned between a non-planar thermal bridge 102A(1) that has wing sections extending over memory 606 of the main module 104A and a non-planar thermal bridge 102A(2) that covers a CPU 602 of the main module 104A. In contrast, as shown in FIG. 16F, a cooling assembly for an add-on module 104, such as a GPU module 104B positioned vertically relative to a horizontal motherboard 302 of a main module 104A, can have a substantially planar thermal bridge 102B, for example, similar to thermal bridge 102B shown in FIGS. 6A-6C, but without an extension that has a first surface positioned against heat sources 108 of the add-on module 104 and a second surface positioned against a cold plate 110 that is parallel to the add-on module 104 and/or thermal bridge 102B.

The cold plates 110 of multiple dedicated cooling assemblies for different modules 104 can have ports 620 that connect to tubing 202 extending to one or more cooling docks 106. The ports 620 can extend to positions at a housing 502 enclosing the modules 104, such that the ports 620 can be accessed from outside the housing, and/or connections to tubing 202 connecting the cold plates 110 to cooling docks 106 can be outside the housing 502. In some examples, a bracket can be used to fix the ports 620 to the housing, and O-rings or other sealing mechanisms can be used to seal the ports 620 against the bracket.

As described above, in some examples a dedicated cooling assembly can be provided for an individual module 104 that includes one or more thermal bridges 102 configured to transfer heat away from heat sources 108 of the module 104 to one or more cold plates 110 that include a fluid path 112. The cold plate 110 itself can have ports 620 that connect the fluid path 112 to tubing 202 that extends to, and through, a separate cooling dock 106 that may include other components, such as a pump 204, a radiator 206, and/or fan system 208 including one or more fans. While in some examples a cold plate 110 can be attached to one or more thermal bridges 102 in a cooling assembly using bolts, screws, or other connectors, in other examples a thermal bridge 102 and/or a cold plate 110 can include a tool-less mechanism configured to lock a cold plate 110 in place against a thermal bridge 102. Such a tool-less mechanism can allow a cold plate 110 to be locked to, and/or unlocked from, a thermal bridge 102 without tools, thereby easing the installation process and/or reducing installation and/or disassembly times.

Figure 17A:
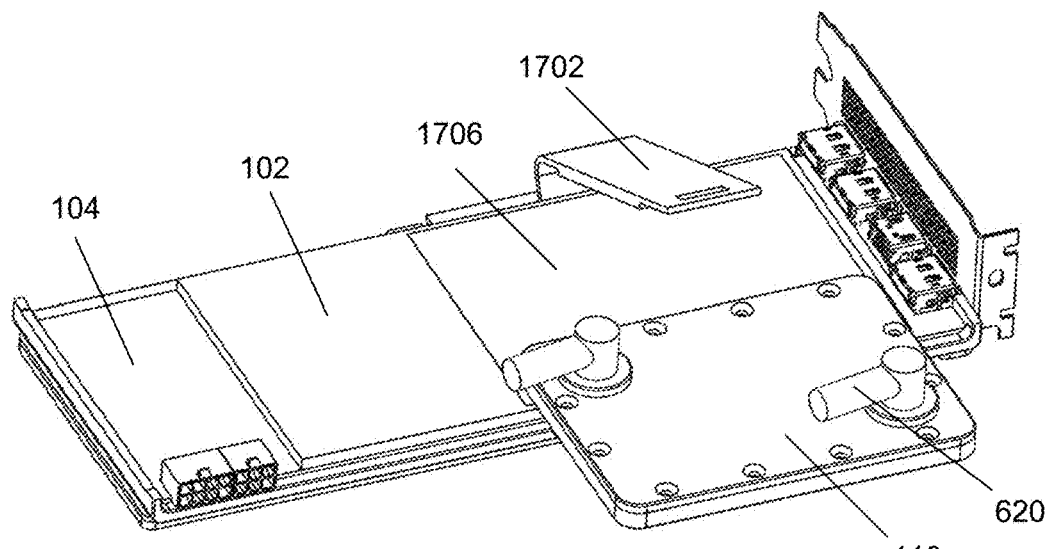
FIGS. 17A-17C depict a first example of a tool-less mechanism configured to lock a cold plate to a thermal bridge.
Figure 17B:
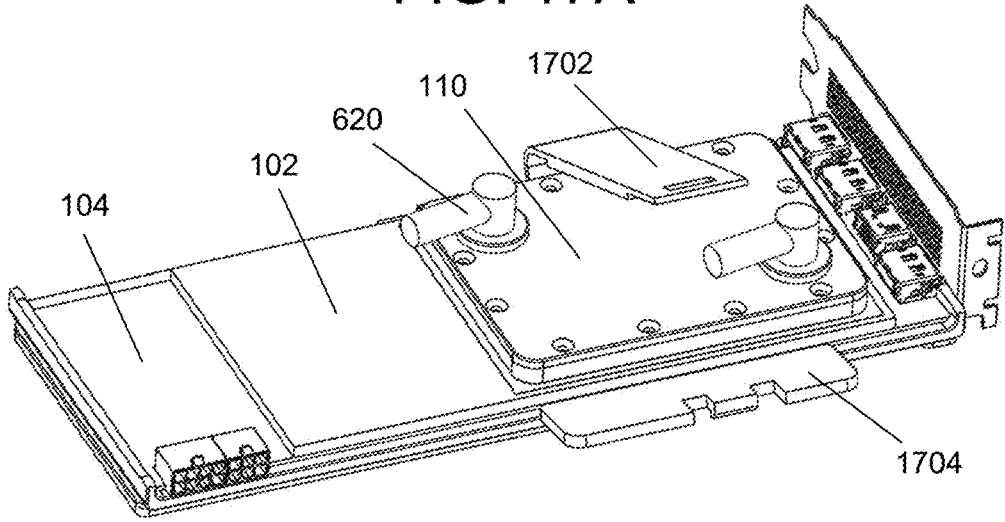
Figure 17C:
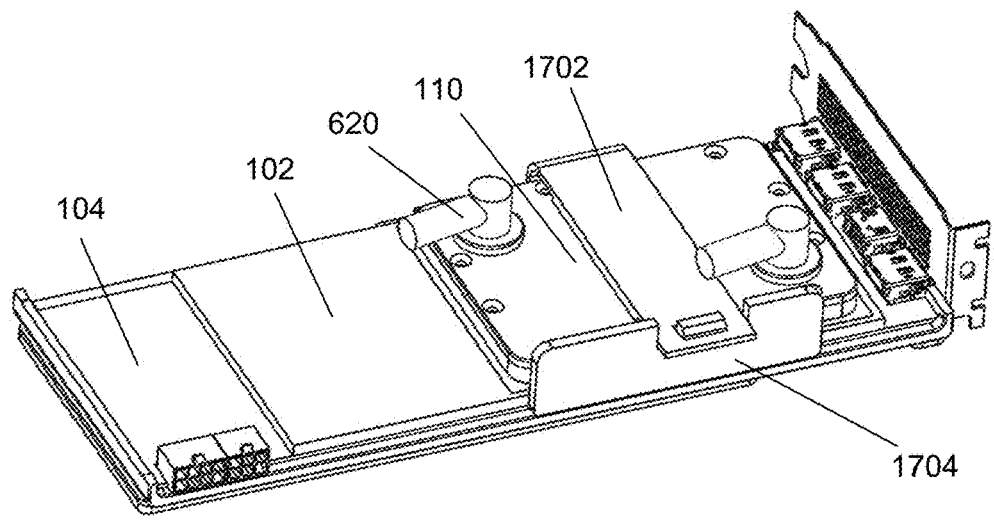

FIGS. 17A-17C depict a first example of a tool-less mechanism configured to lock a cold plate 110 to a thermal bridge 102. In FIGS. 17A-17C, a thermal bridge 102 can cover at least a portion of a motherboard 302 or other board 308 of a module 104 and be in thermal contact with heat sources 108 of the module 104 to draw heat away from the heat sources 108. For example, when the module 104 is a GPU module 104B, the thermal bridge 102 can be in thermal contact with a GPU 610. The thermal bridge 102 can have a tool-less locking mechanism including a lever piece 1702 and a locking piece 1704. The lever piece 1702 and/or the locking piece 1704 can be axle-pinned to the thermal bridge 102, such that one or both are rotatable for locking and unlocking. As shown in FIGS. 17A-17C, a cold plate 110 can be fit against the thermal bridge 102. In some examples, TIMs 1706, such as a graphite sheet or a layer of thermal paste, can be positioned between the thermal bridge 102 and the cold plate 110. When the cold plate 110 is in place against the thermal bridge 102, the lever piece 1702 and locking piece 1704 can be brought together, such that a latch on the locking piece 1704 hooks into a slot in the lever piece 1702, thereby locking the cold plate 110 tightly onto the thermal bridge 102. When the lever piece 1702 is unlatched from the locking piece 1704, the cold plate 110 can be free to be removed.

Figure 18A:
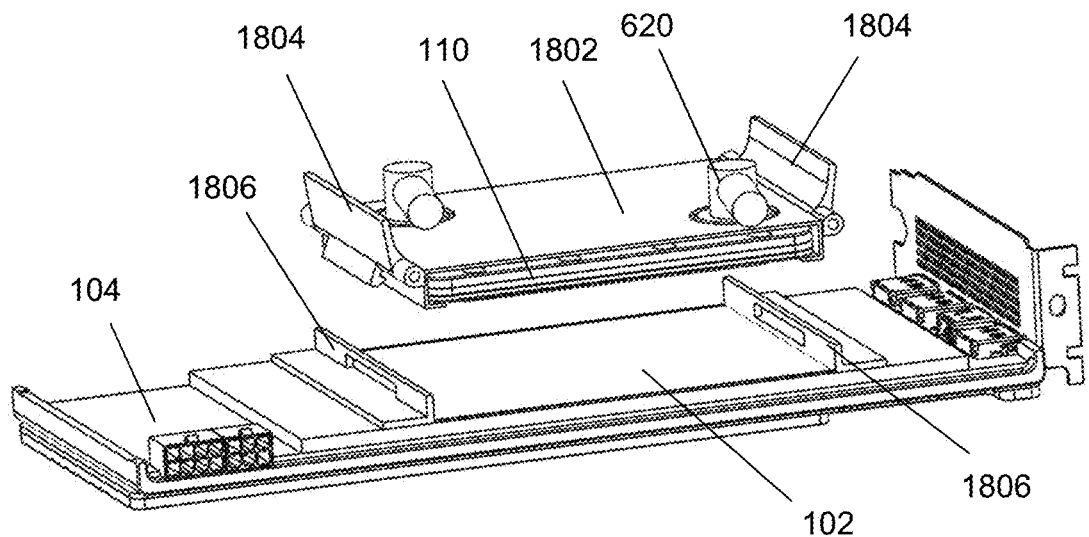
FIGS. 18A and 18B depict a second example of a tool-less mechanism configured to lock a cold plate to a thermal bridge.
Figure 18B:
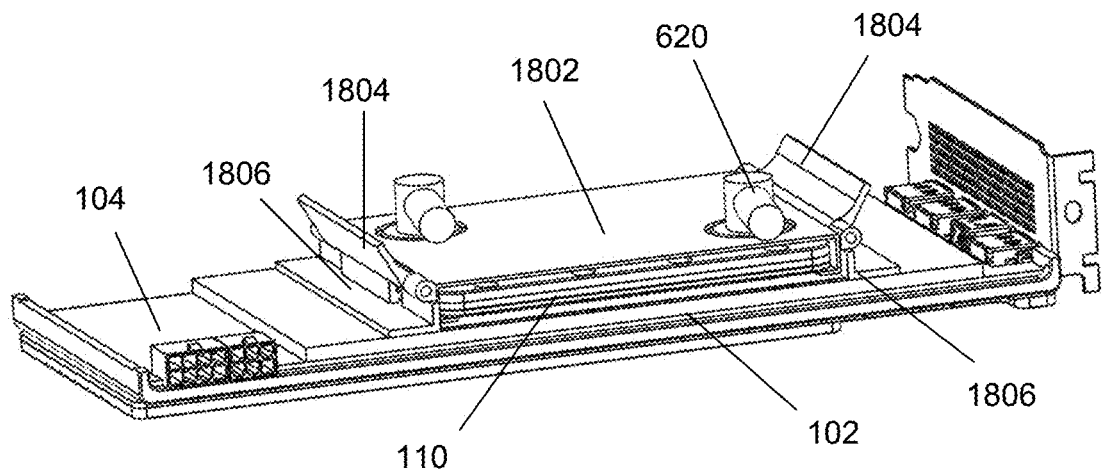

FIGS. 18A and 18B depict a second example of a tool-less mechanism configured to lock a cold plate 110 to a thermal bridge 102. In FIGS. 18A and 18B, a cold plate 110 can be partially housed in a case 1802. In some examples, the case 1802 can include holes for ports 620 of the cold plate 110, or otherwise allow the ports 620 to be accessed. The case 1802 can have clips 1804, for instance on opposing ends of the case 1802, that fit into anchors 1806 on the thermal bridge 102. In some examples, the clips 1804 can be spring-loaded and configured to be pinched or depressed by hand. During installation, the cold plate 110 can be fit into the case 1802. The cold plate 110 and the case 1802 can be pressed against the thermal bridge 102, such that the cold plate 110 is in thermal contact with the thermal bridge 102. The clips 1804 can latch into slots in the anchors 1806 on the thermal bridge 102, such that the cold plate 110 can be locked tightly onto the thermal bridge 102. Depressing the clips 1804 can later allow the cold plate 110 and case 1802 to be removed from the thermal bridge 102.

Figure 19A:
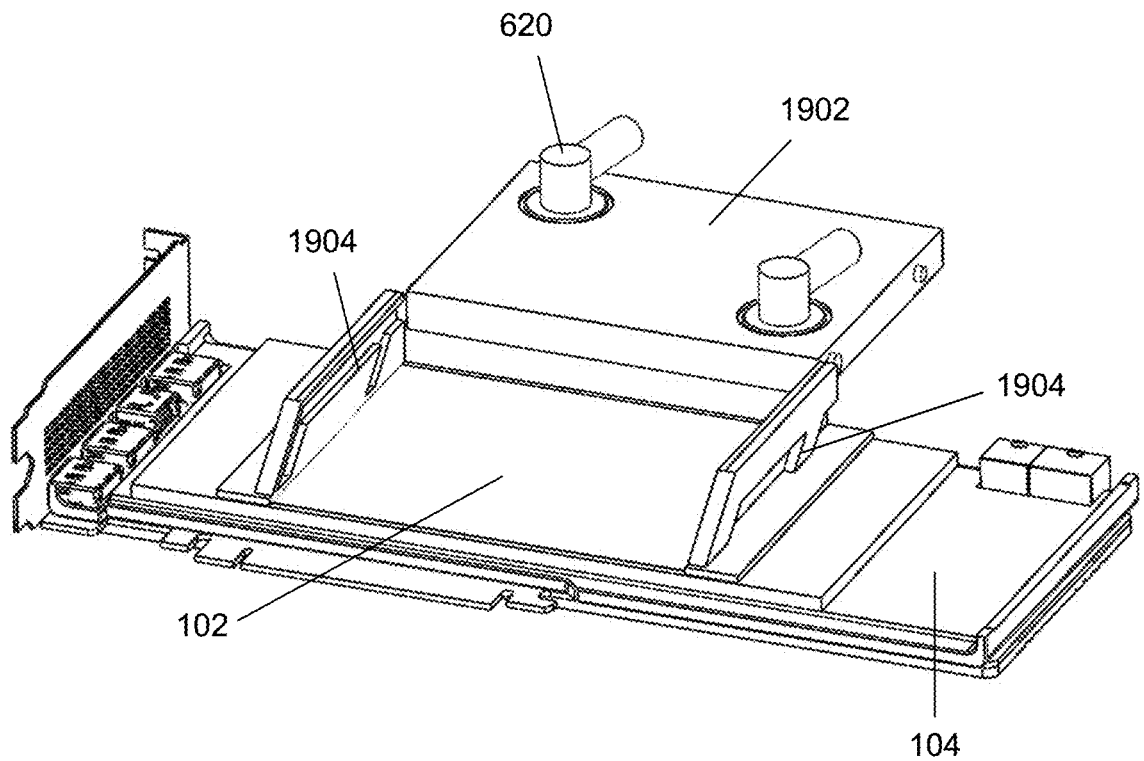
FIGS. 19A and 19B depict a third example of a tool-less mechanism configured to lock a cold plate to a thermal bridge.
Figure 19B:
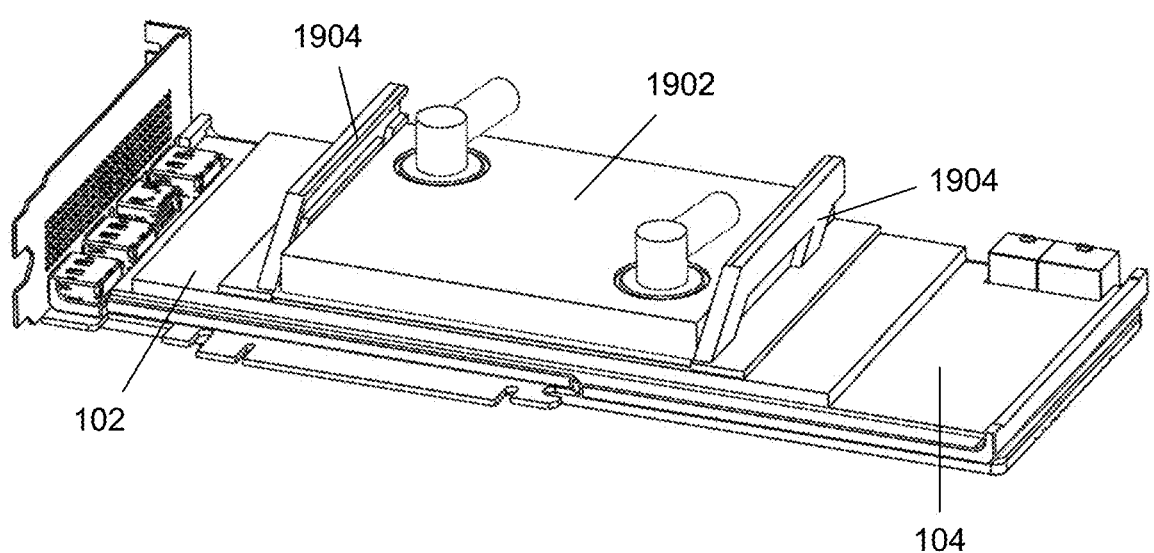

FIGS. 19A and 19B depict a third example of a tool-less mechanism configured to lock a cold plate 110 to a thermal bridge 102. In FIGS. 19A and 19B, the tool-less mechanism can include a sliding casing 1902 that at least partially houses the cold plate 110, as well as guide rails 1904 on the thermal bridge 102. In some examples, the sliding casing 1902 can include holes for ports 620 of the cold plate 110, or otherwise allow the ports 620 to be accessed. In some examples, the guide rails 1904 on the thermal bridge 102 can have symmetric curved slots, and pins or other protrusions on edges of the sliding casing 1902, or of the cold plate 110, can be inserted into the slots of the guide rails 1904, such that the sliding casing 1902 and cold plate 110 can slide between the guide rails 1904 and be pressed down. During installation of the cold plate 110, the cold plate 110 can be enclosed in the sliding casing 1902, the sliding casing 1902 and cold plate 110 can be inserted between the two guide rails 1904, and the sliding casing 1902 and cold plate 110 can be pushed in by hand. The slots on the guide rails 1904 can guide the pushing force to press the cold plate 110 tightly against the thermal bridge 102 and lock the cold plate 110 tightly in place against the thermal bridge 102.

Figure 20A:
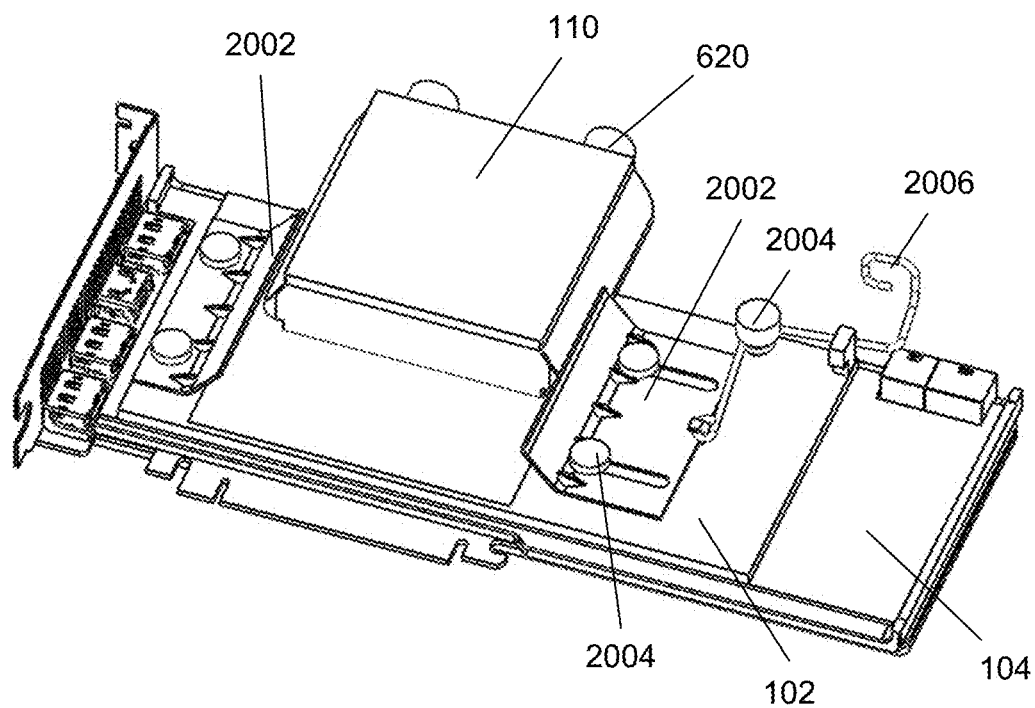
FIGS. 20A and 20B depict a fourth example of a tool-less mechanism configured to lock a cold plate to a thermal bridge.
Figure 20B:
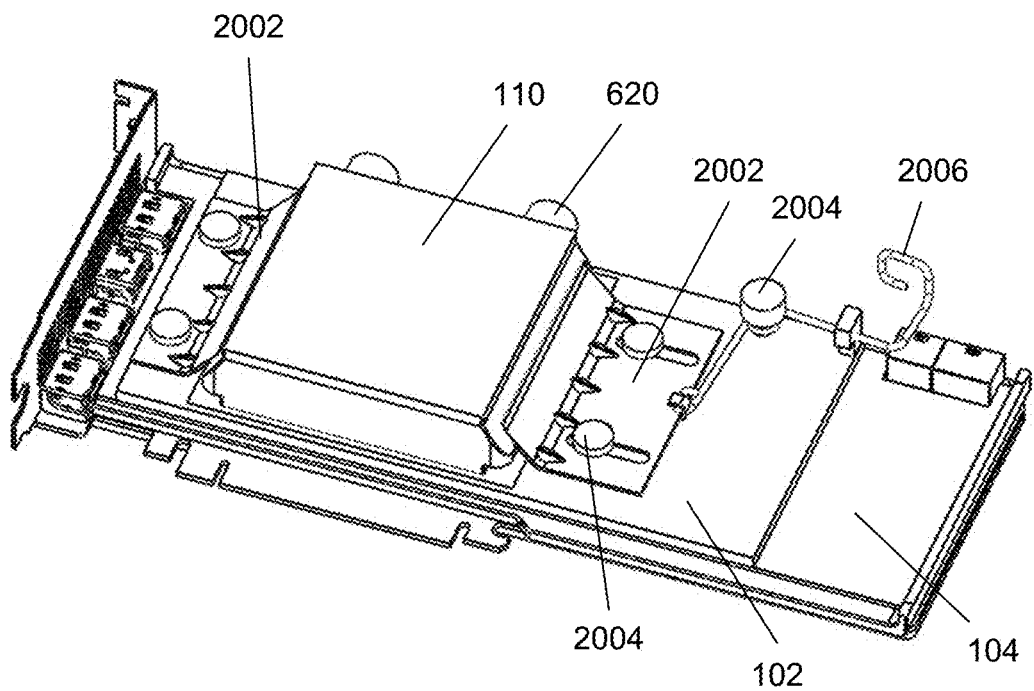

FIGS. 20A and 20B depict a fourth example of a tool-less mechanism configured to lock a cold plate 110 to a thermal bridge 102. In FIGS. 20A and 20B, the thermal bridge 102 can have side clamps 2002 configured to clamp a cold plate 110 against the thermal bridge 102 on at least two sides. At least one of the side clamps 2002 can be slideably installed on the thermal bridge 102, for example, via anchor clips 2004 that extend through slots in the side clamps 2002. A spring lock 2006 can be a side clamp 2002 and be routed past the anchor clips 2004 or other elements of the thermal bridge 102, such that movement of the spring lock 2006 can move the side clamp 2002 in or out to lock or unlock a cold plate 110 between the side clamps 2002. For example, during installation, a cold plate 110 can be positioned against the thermal bridge 102 between a fixed side clamp 2002 and a slideable side clamp 2002. Movement of the spring lock 2006 can push the slideable side clamp 2002 toward the cold plate 110, such that the cold plate 110 is held between the fixed side clamp 2002 and the slideable side clamp 2002. The spring lock 2006 can be clipped into position against an anchor clip 2004 to lock the elements in place, including locking the cold plate 110 tightly in place against the thermal bridge 102, for example, as shown in FIG. 20B.

Figure 21A:
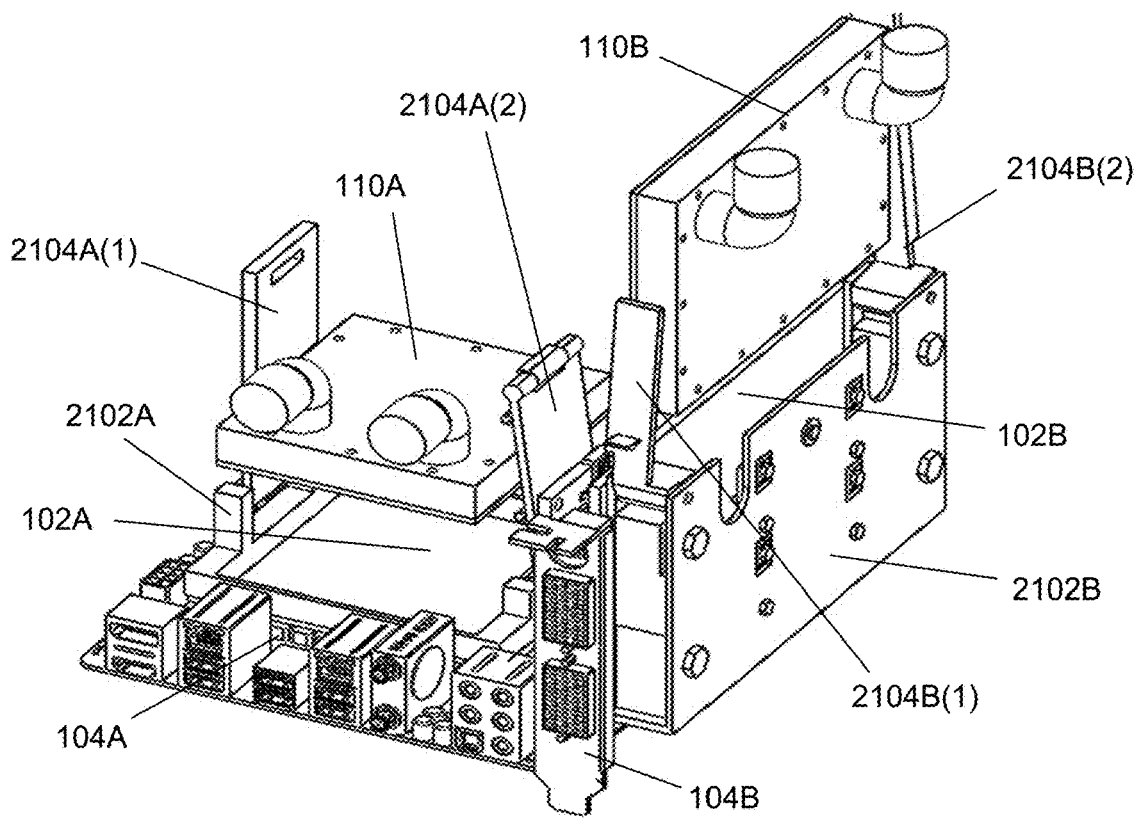
FIGS. 21A-21D depict views of a computing system that includes multiple modules with tool-less mechanisms for installing dedicated cold plates for different modules.
Figure 21B:
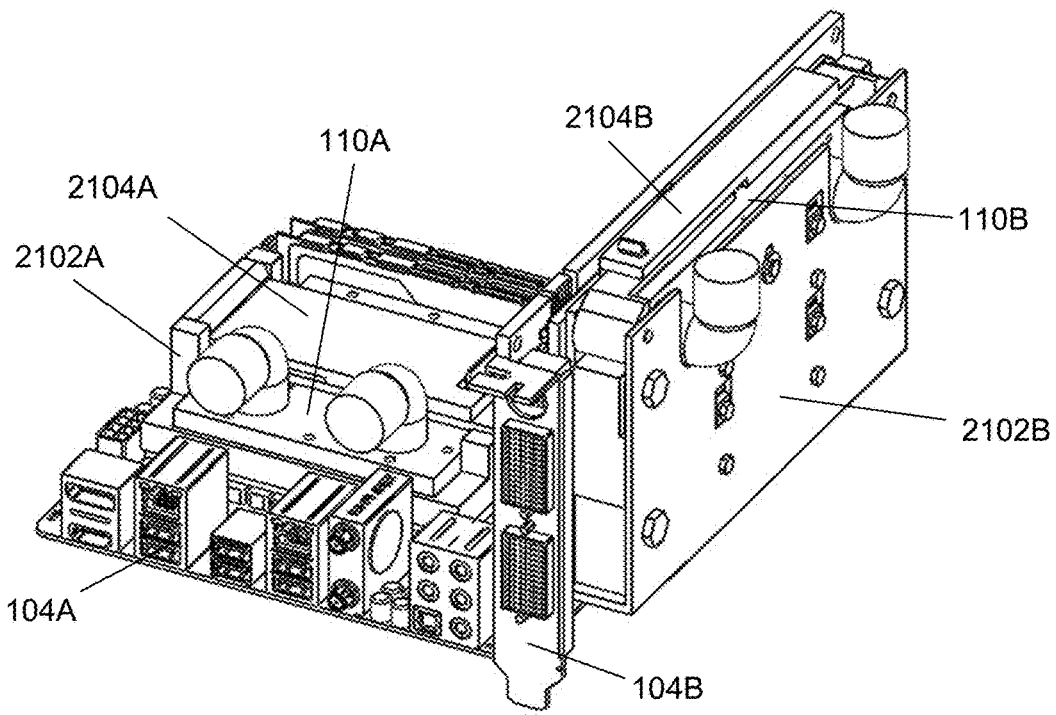

FIGS. 21A-21D depict views of a computing system 100 that includes multiple modules 104 with tool-less mechanisms for installing dedicated cold plates 110 for different modules 104. Each of the modules 104 can have at least one thermal bridge 102 in thermal contact with heat sources 108 of the modules 104. For example, as shown in FIGS. 21A and 21B, a main module 104A can have a first thermal bridge 102A installed against a CPU 602 and/or other heat sources 108, while a second module 104B can have a second thermal bridge 102B installed against a GPU 610 and/or other heat sources 108.

Figure 21C:
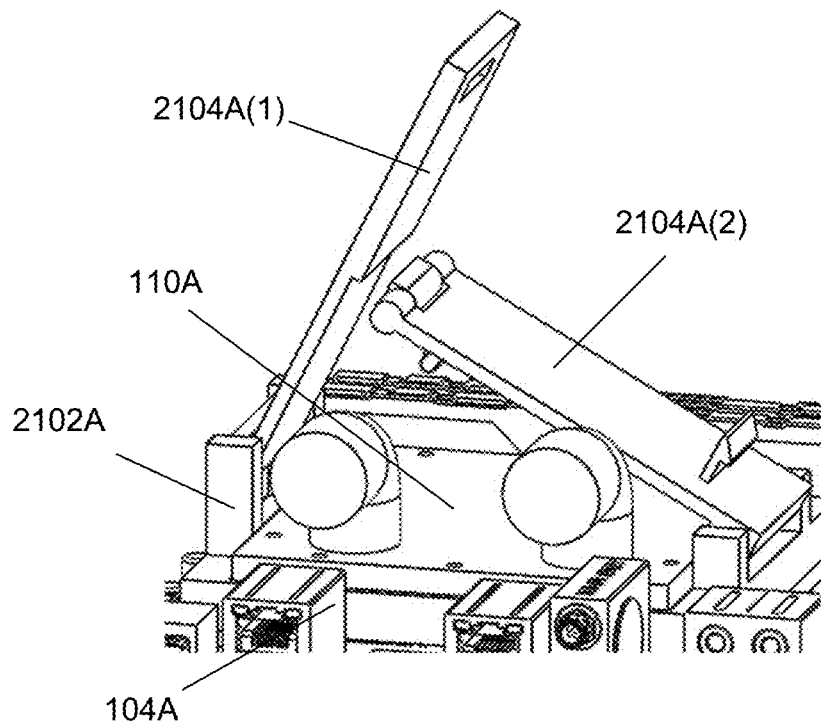
Figure 21D:
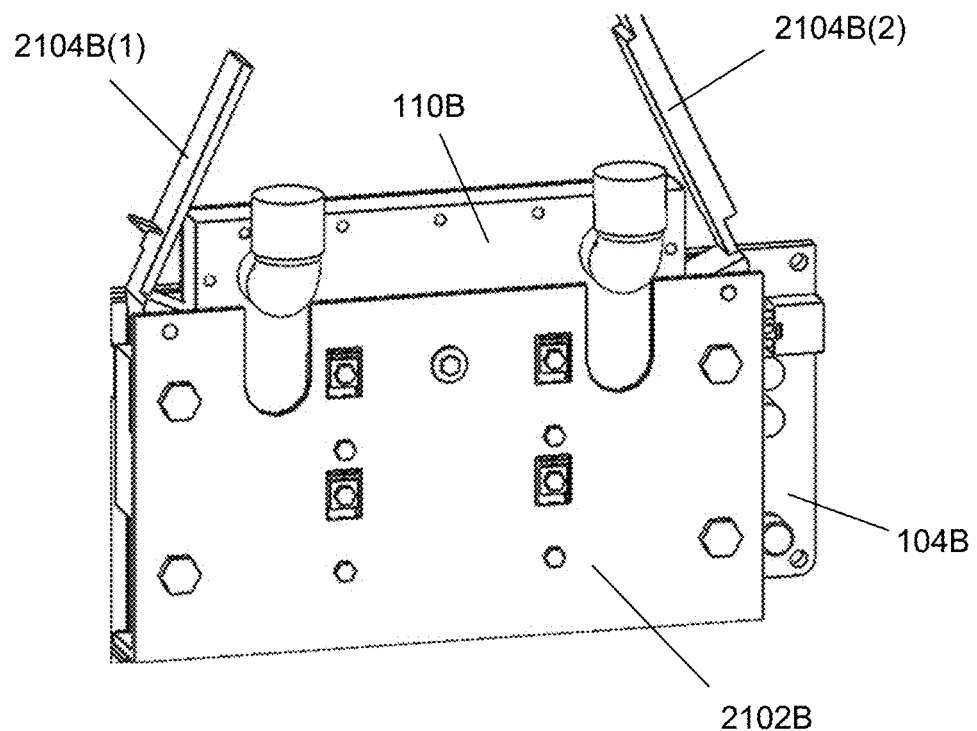

A cold plate fixture 2102 configured to accept a cold plate 110 can be part of, or installed proximate to, each thermal bridge 102. For example, a first cold plate fixture 2102A can be positioned around portions of the first thermal bridge 102A for the main module 104A, such that a first cold plate 110A can fit into the first cold plate fixture 2102A and be held in thermal contact against the first thermal bridge 102A. FIG. 21C depicts a close-up view of portions of the first cold plate fixture 2102A. Similarly, a second cold plate fixture 2102B can be positioned around portions of the second thermal bridge 102B for the second module 104B, such that a second cold plate 110B can fit into the second cold plate fixture 2102B and be held in thermal contact against the second thermal bridge 102B. FIG. 21D depicts a close-up view of portions of the second cold plate fixture 2102B. A cold plate fixture 2102 can be top-loading like the first cold plate fixture 2102A, side-loading or slot-loading like the second cold plate fixture 2102B, or accept a cold plate 110 in any other orientation. Each cold plate fixture 2102 can have holes or slots, so that ports 620 of the cold plates 110 can extend out of the cold plate fixture 2102 to be accessible.

Each cold plate fixture 2102 can have one or more locking arms 2104 configured to lock in place to hold an inserted cold plate 110 in position within the cold plate fixture 2102. In some examples, each cold plate fixture 2102 can have two locking arms 2104, one with a latch and one with a slot for the latch, such that the locking arm 2104 with the latch can be closed down over an inserted cold plate 110 first, and then the other locking arm 2104 with the slot can be pressed down by hand, so that the latch clicks into the slot to hold the cold plate 110 in position, as shown in FIG. 21C.

In some examples, individual modules 104 and corresponding attached thermal bridges 102, cold plate fixtures 2102, and/or cold plates 110 can be installed or removed as one piece within a computing system 100. For example, individual cooling assemblies described herein for individual modules 104 can be assembled separately and then installed into a larger computing system 100 along with the modules 104, or can be removed with modules 104 and then be disassembled. However, in other examples cooling assemblies for individual modules 104 can be installed or removed while the modules 104 remain in place in a computing system 100.

Although the subject matter has been described in language specific to structural features and/or methodological acts, it is to be understood that the subject matter is not necessarily limited to the specific features or acts described above. Rather, the specific features and acts described above are disclosed as example embodiments.

What is claimed is:

1. A cooling system comprising:
   at least one cold plate having a fluid path for liquid coolant;

a first thermal bridge comprising at least a first heat absorption portion in thermal contact with one or more first heat sources of a first module of a particular modular computing system, and at least a first heat dissipation portion in thermal contact with the at least one cold plate;

a second thermal bridge comprising at least a second heat absorption portion in thermal contact with one or more second heat sources of a second module of the particular modular computing system, and at least a second heat dissipation portion in thermal contact with the at least one cold plate; and a cooling dock comprising a pump, one or more cooling elements, and tubing connected to the fluid path of the at least one cold plate, wherein the pump is configured to cause the liquid coolant to flow from the at least one cold plate through the tubing to the one or more cooling elements, wherein at least one of the first module or the second module is selectively removable from the particular modular computing system, wherein the first module and the second module are different types of modules associated with different functions of the particular modular computing system, and wherein at least one of the first thermal bridge or the second thermal bridge comprises a self-organizing thermodynamic system (SOTS) comprising one or more networks of interconnected capillary microchannels holding a two-phase working fluid.

2. The cooling system of claim 1, wherein the at least one cold plate is positioned within a cooling dock housing of the cooling dock, and the first thermal bridge and the second thermal bridge extend from the first module and the second module into the cooling dock housing.

3. The cooling system of claim 1, wherein the at least one cold plate comprises a first cold plate in thermal communication with the first thermal bridge and a second cold plate in thermal communication with the second thermal bridge, wherein a first fluid path of the first cold plate and a second fluid path of the second cold plate are both in fluid communication with the tubing of the cooling dock.

4. The cooling system of claim 1, wherein the one or more cooling elements of the cooling dock includes at least one of a radiator or a fan.

5. The cooling system of claim 1, wherein one of the first thermal bridge or the second thermal bridge comprises at least one of a heat pipe or a vapor chamber.

6. The cooling system of claim 1, wherein the first thermal bridge and the second thermal bridge are passive heat transfer devices configured to transfer heat generated by the one or more first heat sources and the one or more second heat sources to the at least one cold plate, and wherein the liquid coolant flows through the fluid path of the at least one cold plate to transfer the heat away from the at least one cold plate to be dissipated in the cooling dock.

7. The cooling system of claim 1, wherein the first module includes a motherboard comprising a peripheral connector, and wherein the second module is a graphics card coupled to the motherboard via the peripheral connector.

8. The cooling system of claim 1, wherein:
the one or more first heat sources of the first module comprises:
a first heat source having a first height relative to a board of the first module; and
at least one second heat source having a second height relative to the board, wherein the second height is different than the first height, and
the first thermal bridge is non-planar and comprises:
a first contact surface configured to contact the first heat source; and
at least one second contact surface configured to contact the at least one second heat source.

9. The cooling system of claim 8, wherein:
the first heat source is a central processing unit (CPU),
the second heat source comprises one or more memory modules, and the first thermal bridge comprises:
a first planar section in thermal contact with the CPU; and
one or more non-planar wing sections that extend from the first planar section and cover at least a portion of the one or more memory modules.

10. The cooling system of claim 9, wherein the at least one cold plate comprises a first cold plate positioned against the first planar section of the first thermal bridge between two of the one or more non-planar wing sections.

11. The cooling system of claim 1, further comprising a tool-less mechanism configured to lock the at least one cold plate to the first thermal bridge during installation.

12. The cooling system of claim 1, wherein the at least one cold plate comprises a first cold plate integrated into a first solid body of the first thermal bridge.

13. The cooling system of claim 12, wherein:
the at least one cold plate further comprises a second cold plate integrated into a second solid body of the second thermal bridge, and
the cooling dock comprises a manifold with a plurality of fluid ports configured to removably connect to fluid paths of the first cold plate and the second cold plate.

14. The cooling system of claim 1, wherein the first thermal bridge has a form factor based on a shape of the first module and positions of the one or more first heat sources on the first module.

15. A cooling system comprising:
a cooling dock comprising a pump, at least one cooling element, and tubing; and
a plurality of modules of a modular computing system, wherein individual modules of the plurality of modules each comprise:
one or more heat sources; and
a dedicated cooling assembly comprising:
at least one cold plate having a fluid path connected to the tubing; and
a dedicated thermal bridge in thermal communication with the one or more heat sources and with the at least one cold plate,
wherein the dedicated thermal bridge comprises a self-organizing thermodynamic system (SOTS) comprising one or more networks of interconnected capillary microchannels holding a two-phase working fluid, and is configured to passively transfer heat from the one or more heat sources to the at least one cold plate,
wherein the pump of the cooling dock is configured to pump liquid coolant through the tubing and the fluid path to transfer heat absorbed by the at least one cold plate from the dedicated thermal bridge to the at least one cooling element, and
wherein the plurality of modules includes at least two types of modules associated with different functions of the modular computing system.

16. The cooling system of claim 15, wherein the plurality of modules comprises:
a motherboard comprising a peripheral connector; and at least one removable add-on module configured to couple with the motherboard via the peripheral connector.

17. The cooling system of claim 15, wherein the dedicated thermal bridge, associated with a particular module of the plurality of modules, has a form factor based on a shape of the particular module and positions of the one or more heat sources of the particular module.

18. A method comprising:
connecting at least one cold plate to a first thermal bridge associated with a first module of a modular computing system and to a second thermal bridge associated with a second module of the modular computing system, the first module comprising a first set of heat sources and the second module comprising a second set of heat sources; and
connecting one or more fluid paths of the at least one cold plate to tubing of a cooling dock comprising a pump and at least one cooling element,
wherein the first thermal bridge is configured to passively transfer heat from the first set of heat sources to the at least one cold plate,
wherein the second thermal bridge is configured to passively transfer heat from the second set of heat sources to the at least one cold plate,
wherein the pump is configured to cause liquid coolant to flow through the tubing and the one or more fluid paths of the at least one cold plate to transfer the heat away from the at least one cold plate to the at least one cooling element of the cooling dock,
wherein at least one of the first module and the second module is selectively removable from the modular computing system,
wherein the first module and the second module are different types of modules associated with different functions of the modular computing system, and
wherein at least one of the first thermal bridge or the second thermal bridge comprises a self-organizing thermodynamic system (SOTS) comprising one or more networks of interconnected capillary microchannels holding a two-phase working fluid.

19. The method of claim 18, wherein connecting the at least one cold plate to the first thermal bridge and to the second thermal bridge comprises:
placing the at least one cold plate against one of the first thermal bridge or the second thermal bridge; and
locking the at least one cold plate in position via a tool-less mechanism.

20. The method of claim 18, wherein:
the first module is a motherboard comprising a peripheral connector; and
the second module is a removable add-on module configured to couple with the motherboard via the peripheral connector.

* * * * *